United States Patent
Petersen et al.

(10) Patent No.: US 10,477,707 B1
(45) Date of Patent: Nov. 12, 2019

(54) APPARATUSES, SYSTEMS, AND METHODS FOR PERFORMING HARDWARE ACCELERATION VIA DUAL-COMPACT-FORM-FACTOR EXPANSION CARDS

(71) Applicant: Facebook, Inc., Menlo Park, CA (US)

(72) Inventors: Christian Markus Petersen, Golden, CO (US); William Christie Arnold, Menlo Park, CA (US); Hao Shen, Milpitas, CA (US); Austin Joel Cousineau, Menlo Park, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/118,417

(22) Filed: Aug. 30, 2018

(51) Int. Cl.
*H05K 1/02* (2006.01)
*H05K 5/00* (2006.01)
*G06F 9/50* (2006.01)
*H05K 7/14* (2006.01)

(52) U.S. Cl.
CPC ......... *H05K 5/0069* (2013.01); *G06F 9/5027* (2013.01); *H05K 5/003* (2013.01); *H05K 7/1418* (2013.01)

(58) Field of Classification Search
CPC .... H05K 5/0069; H05K 5/003; H05K 7/1418; G06F 9/5027
USPC ........................................ 361/748
See application file for complete search history.

(56) References Cited

U.S. PATENT DOCUMENTS

2017/0308499 A1* 10/2017 Sardaryan .............. G06K 7/042

OTHER PUBLICATIONS

"Edge Connector," accessed at https://en.wikipedia.org/w/index.php?title=Edge_connector&oldid=736591535, accessed on Aug. 28, 2018.
"Expansion Card," accessed at https://en.wikipedia.org/w/index.php?title=Expansion_card&oldid=852493355, accessed on Aug. 28, 2018.
"M.2," accessed at https://en.wikipedia.org/w/index.php?title=M.2&oldid=849419042, accessed on Aug. 28, 2018.
"Pinout," accessed at https://en.wikipedia.org/w/index.php?title=Pinout&oldid=846198631, accessed on Aug. 28, 2018.

* cited by examiner

*Primary Examiner* — Tremesha S Willis
(74) *Attorney, Agent, or Firm* — FisherBroyles, LLP

(57) ABSTRACT

A disclosed expansion card may include a printed circuit board and a hardware accelerator. The hardware accelerator may be disposed on the printed circuit board and may include application-specific hardware circuitry designed to perform a computing task. The hardware accelerator may offload a portion of the computing task from a central processing unit of a computing device by executing, via the application-specific hardware circuitry, the portion of the computing task. The expansion card may also include an edge connector, disposed on a connecting edge of the printed circuit board, that may couple the hardware accelerator to the central processing unit via a computing bus. The edge connector may also include a primary pinout and a secondary pinout that may each conform to a compact pinout specification that may be more compact than a pinout specification defined for the computing bus. Various other systems and methods are also disclosed.

20 Claims, 14 Drawing Sheets

APPARATUSES, SYSTEMS, AND METHODS FOR PERFORMING HARDWARE ACCELERATION VIA DUAL-COMPACT-FORM-FACTOR EXPANSION CARDS

BACKGROUND

Demand for efficient execution of complex computational tasks (such as video transcoding and artificial intelligence operations, among others) is expanding at an ever-increasing rate. Complex computational tasks are often assigned to powerful data center servers (e.g., domain controllers), as other devices (e.g., edge servers) may lack the computing resources necessary to effectively and/or efficiently complete these demanding tasks. However, deploying and maintaining domain controllers may be expensive, and adding domain controllers to scale a data center for high-demand computing tasks may be inefficient and/or impractical, especially in high-growth points-of-presence (POPS) traditionally serviced by edge servers. Moreover, due to their general-purpose design, domain controllers may struggle with and/or inefficiently handle some highly specific and demanding tasks.

Additionally, while some traditional hardware devices may be capable of performing some operations included in these complex computational tasks, such devices may be difficult to implement in some kinds of computing devices, such as edge servers, due to physical space limitations, computing power restrictions, electrical power requirements, heating and/or cooling needs, and/or data bandwidth considerations. Therefore, the present disclosure identifies and addresses a need for improved apparatuses, systems, and methods for performing hardware acceleration of complex computational tasks.

SUMMARY

As will be described in greater detail below, the instant disclosure presents various apparatuses, systems, and methods for effectively and efficiently conducting complex computational tasks by hardware accelerating the same using dual-compact-form-factor expansion cards. In one example, such an expansion card may include a printed circuit board and a hardware accelerator. In at least one embodiment, the hardware accelerator may be disposed on the printed circuit board and may include application-specific hardware circuitry designed to perform a computing task. In some embodiments, the hardware accelerator may offload at least a portion of the computing task from a central processing unit of a computing device by executing, via the application-specific hardware circuitry, the portion of the computing task.

In at least some examples, the expansion card may also include an edge connector, disposed on a connecting edge of the printed circuit board, that may be dimensioned to be inserted into an expansion socket of the computing device. The edge connector may couple the hardware accelerator to the central processing unit via a computing bus connected to the expansion socket when inserted into the expansion socket. The edge connector may also include a primary pinout, disposed within a primary portion of the edge connector, and a secondary pinout, disposed within a secondary portion of the edge connector. Each of the primary pinout and the secondary pinout may conform to a compact pinout specification included in a compact expansion card specification, and the compact pinout specification may be more compact than a pinout specification defined for the computing bus. In some examples, the compact expansion card specification may include at least one of (1) an M.2 specification, (2) a U.2 specification, or (3) an mSATA specification.

In some embodiments, the primary portion of the edge connector and the secondary portion of the edge connector may be disposed along the edge connector such that a lateral center line of the primary portion of the edge connector may be disposed a predefined distance from a lateral center line of the secondary portion of the edge connector. In at least one embodiment, the predefined distance from the lateral center line of the secondary portion of the edge connector may be, within a predefined manufacturing tolerance, 22.5 millimeters.

In various embodiments, the primary portion of the edge connector may define a primary key notch, the secondary portion of the edge connector may define a secondary key notch, and a width of the primary key notch may be narrower than a width of the secondary key notch. In at least some embodiments, the primary key notch may have a width, within a predefined manufacturing tolerance, of up to 1.2 millimeters, and the secondary key notch may have a width, within the predefined manufacturing tolerance, of at least 1.4 millimeters.

In some examples, the primary pinout may include a primary set of connector traces and the secondary pinout may include a secondary set of connector traces. In at least one example, each connector trace included in the primary set of connector traces and the secondary set of connector traces may be manufactured in accordance with (1) a target routing tolerance that is narrower than a routing tolerance specification included in the compact expansion card specification, and (2) a target true position that is narrower than a true position specification included in the compact expansion card specification. In additional or alternative examples, the primary set of connector traces and the secondary set of connector traces may be manufactured in accordance with a target routing tolerance of within 0.05 millimeters and a target true position of within 0.12 millimeters.

In some embodiments, the printed circuit board may include a width dimension that may include (1) a multiple of a width specification included in the compact expansion card specification, and (2) a predefined buffer distance. In additional embodiments, the printed circuit board may include a length dimension that may conform to a length specification included in the compact expansion card specification. In at least one embodiment, the printed circuit board may include a width dimension, within a predefined manufacturing tolerance, of 46 millimeters, and a length dimension, within the predefined manufacturing tolerance, of 110 millimeters.

In at least one example, the printed circuit board may further include a primary fixing notch, defined by an edge of the printed circuit board that is opposite to the connecting edge of the printed circuit board, that is centrally aligned with a center point of the primary portion of the edge connector. The printed circuit board may also include a fixing notch, defined by the edge of the printed circuit board that is opposite to the connecting edge of the printed circuit board, that is centrally aligned with a center point of the secondary portion of the edge connector.

In additional examples, the hardware accelerator may include at least one of (1) a field-programmable gate array, or (2) an application-specific integrated circuit. In at least one example, the computing task that the application-specific hardware circuitry may be designed to perform may include an artificial intelligence inference task that applies a model trained on known data to infer at least one label for new data. In additional or alternative examples, the computing task that the application-specific hardware circuitry is designed to perform may include a video transcoding task.

Similarly, a system that incorporates the above-described apparatus may include a central processing unit, at least one memory device, at least one expansion socket, and at least one expansion card. The expansion card may include a printed circuit board and at least one hardware accelerator that may be disposed on the printed circuit board. The hardware accelerator may include application-specific hardware circuitry designed to perform a computing task. In some examples, the hardware accelerator may offload at least a portion of the computing task from the central processing unit by executing, via the application-specific hardware circuitry, the portion of the computing task.

The expansion card may also include an edge connector, disposed on a connecting edge of the printed circuit board, that is dimensioned to be inserted into the expansion socket. The edge connector may couple the hardware accelerator to the central processing unit via a computing bus connected to the expansion socket when the expansion card is inserted into the expansion socket. The edge connector may include a primary pinout, disposed within a primary portion of the edge connector, and a secondary pinout, disposed within a secondary portion of the edge connector. In at least some embodiments, each of the primary pinout and the secondary pinout may conform to a compact pinout specification included in a compact expansion card specification, and the compact pinout specification may be more compact than a pinout specification defined for the computing bus.

In at least some examples, the expansion socket may be disposed on an intermediary expansion card that may include a pinout that conforms to the pinout specification defined for the computing bus. In one or more examples, the system may include a backend data center of a corporate networking enterprise that provides at least one online service to corresponding users of client devices.

A corresponding method may include disposing at least one hardware accelerator on a printed circuit board. In some examples, the hardware accelerator may include application-specific hardware circuitry designed to perform a computing task and may offload at least a portion of the computing task from a central processing unit of a computing device. In at least one embodiment, the hardware accelerator may offload the computing task by executing, via the application-specific hardware circuitry, the portion of the computing task. In some embodiments, the method may further include forming, on a connecting edge of the printed circuit board, an edge connector that is dimensioned to be inserted into an expansion socket of the computing device and that couples the hardware accelerator to the central processing unit via a computing bus connected to the expansion socket when inserted into the expansion socket. In at least one embodiment, forming the edge connector may include forming (1) a primary pinout within a primary portion of the edge connector, and (2) a secondary pinout within a secondary portion of the edge connector. In some examples, each of the primary pinout and the secondary pinout may conform to a compact pinout specification included in a compact expansion card specification, and the compact pinout specification may be more compact than a pinout specification defined for the computing bus.

In some embodiments, forming the edge connector may further include forming (1) a primary key notch within the primary portion of the edge connector in accordance with the compact expansion card specification, and (2) a secondary key notch within the secondary portion of the edge connector. In such embodiments, the primary key notch may have a width that is narrower than a width of the secondary key notch.

In at least some examples, the primary pinout may include a primary set of connector traces, and the secondary pinout may include a secondary set of connector traces. In some such examples, forming the primary pinout and the secondary pinout may include forming each connector trace included in the primary set of connector traces and the secondary set of connector traces in accordance with (1) a target routing tolerance that may be narrower than a routing tolerance specification included in the compact expansion card specification, and (2) a target true position that is narrower than a true position specification included in the compact expansion card specification.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
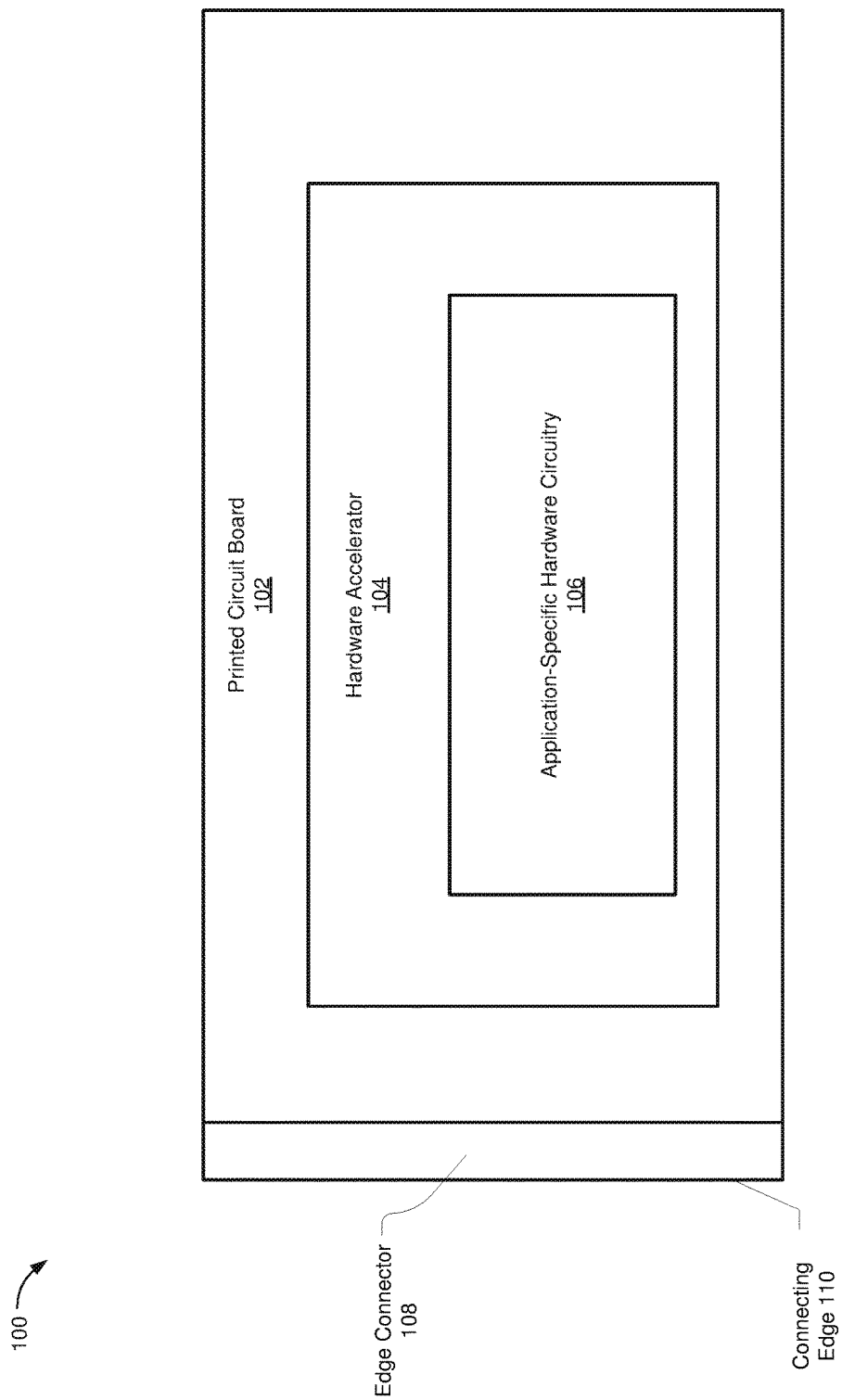
FIG. 1 is a block diagram of an example expansion card that may be capable of performing hardware acceleration.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to apparatuses, systems, and methods for performing hardware acceleration via dual-compact-form-factor expansion cards. As will be explained in greater detail below, the apparatuses, systems, and methods disclosed herein may enable efficient, effective, and scalable hardware acceleration of complex computational tasks by coupling hardware accelerators to dual-compact-form-factor expansion cards. Such dual-compact-form-factor expansion cards may include at least two pinouts (e.g., a primary pinout, a secondary pinout, etc.) that may each conform to at least one compact pinout specification included in a compact expansion card specification (e.g., an M.2 specification, a U.2 specification, an mSATA specification, etc.). Such a compact pinout specification may be more compact than a pinout specification defined for a computing bus (e.g., a PCI EXPRESS bus) that may facilitate communication between components of an expansion card (e.g., a hardware accelerator included in the expansion card) and a central processing unit of a computing device.

While traditional compact-form-factor expansion cards (e.g., M.2 expansion cards, U.2 expansion cards, mSATA expansion cards, etc.) may be used for storage and wireless communication applications, they may have characteristics that are not ideal for some hardware acceleration applications. For example, traditional compact expansion cards may have electrical characteristics and/or data transfer capabilities that may restrict performance attributes of hardware accelerators that may be disposed thereon. Additionally, the physical size of traditional compact-form-factor expansion cards (e.g., M.2 expansion cards, U.2 expansion cards, mSATA expansion cards, etc.) may be insufficient to accommodate some custom application-specific integrated circuits (ASICs) that may be included in hardware accelerator designs now and in the future.

By including multiple pinouts (e.g., at least a primary pinout and a secondary pinout) in a single edge connector, with each pinout conforming to a compact pinout specification, the apparatuses, systems, and methods described herein may make more resources (e.g., electrical resources, bandwidth resources, etc.) available to hardware accelerators disposed on such dual-compact-form-factor expansion cards when compared to traditional compact-form-factor expansion cards. Additionally, including multiple compact-form-factor pinouts along a single edge connector of a dual-compact-form-factor expansion card may enable the dual-compact-form-factor expansion card to have physical dimensions (e.g., a length and/or width) that may accommodate physically larger hardware accelerators than smaller expansion cards (e.g., traditional M.2 expansion cards). Furthermore, by utilizing existing compact expansion card specifications, the dual-compact-form-factor expansion cards disclosed herein may be less complicated to design, simpler to produce, and/or less expensive to deploy than other traditional expansion cards.

In some examples, a "dual-compact-form-factor expansion card" may include any expansion card that includes a plurality of pinouts, disposed within an edge connector that is disposed on a connecting edge of a printed circuit board, that each conform to at least one compact pinout specification included in a compact expansion card specification (e.g., an M.2 specification, a U.2 specification, an mSATA specification, etc.). Indeed, although some of the examples illustrated herein may include dual pinouts (e.g., a primary pinout and a secondary pinout) and/or a printed circuit board with dimensions that may be related to dimensions included in a compact expansion card specification, the principles described herein may encompass a variety of expansion cards having a variety of characteristics such as, without limitation, any plurality of pinouts, any suitable printed circuit board dimensions, any suitable edge connector dimensions, and so forth.

The following will provide, with reference to FIGS. 1-5, examples and illustrations of dual-compact-form-factor expansion cards that are capable of performing hardware acceleration as described herein. Additionally, the description corresponding to FIGS. 6A-6C will provide an overview of exemplary techniques for inserting and/or removing such dual-compact-form-factor expansion cards into corresponding dual-compact-form-factor expansion sockets. The description corresponding to FIGS. 7-11 will illustrate the scalability of these dual-compact-form-factor expansion cards, while the description corresponding to FIG. 12 will describe an exemplary workflow for assembling, creating, forming, and/or manufacturing one or more of the example dual-compact-form-factor expansion cards illustrated in previous figures.

FIG. 1 is a block diagram of an example dual-compact-form-factor expansion card 100 ("expansion card 100") capable of performing hardware acceleration according to the systems and methods disclosed herein. As shown in this figure, expansion card 100 may include printed circuit board 102 and one or more components disposed on printed circuit board 102. An "expansion card" may include a card, such as a card substantially formed by and/or upon a printed circuit board, that is configured for insertion into a corresponding computing device and/or expansion socket to thereby expand the functionality of the computing device.

As shown in FIG. 1, expansion card 100 may include a hardware accelerator 104 disposed on printed circuit board 102. A "hardware accelerator" may include a hardware component or device that performs one or more specialized computing tasks more efficiently, in hardware, than the computing task would be performed in software by a general purpose central processing unit (i.e., a computing chip that is structured to execute a range of different programs as software). In some examples, "hardware acceleration" may include the execution of a computing task in application-specific hardware circuitry that occurs in the absence of a software module intermediary or other layer of abstraction, such that the performance of the application is more efficient (e.g., in terms of computing resources, electrical resources, etc.) than when executed otherwise.

In one example, hardware accelerator 104 may include application-specific hardware circuitry 106 designed to perform a specific computing task. In this example, hardware accelerator 104 may be designed to offload a portion of the specific computing task from a central processing unit of a computing device, such as a data center server, by executing, via application-specific hardware circuitry 106, at least a portion of the specific computing task. In some examples, to "offload a portion of the computing task from a central processing unit of a computing device" may include performing the computing task through the hardware accelerator rather than performing the computing task through a general purpose central processing unit (i.e., a central processing unit of the computing device to which expansion card 100 is coupled, or another central processing unit that might otherwise perform the computing task in the absence of expansion card 100).

Additionally, as will be described in greater detail below in reference to FIGS. 4 and 5, expansion card 100 may also include an edge connector 108, disposed on a connecting edge 110 of printed circuit board 102, that is dimensioned to be inserted into a suitably configured expansion socket of a computing device. In one example, the edge connector, when in the expansion socket, may couple hardware accelerator 104 to the central processing unit of the computing device via a computing bus connected to the expansion socket.

In some examples, an "edge connector" may include one or more connections at an edge of an expansion card (e.g., connecting edge 110) that couple the expansion card to a corresponding computing bus or computing device. In some examples, this edge connector may be formed of a portion of a printed circuit board, such as printed circuit board 102. In addition, this edge connector may include traces (i.e., pins) on the printed circuit board leading to the edge of the board, which may be designed or configured to be plugged into a matching socket. In general, the edge connector may include a male connector that matches a corresponding female connector or socket at a computing device (e.g., on the computing device motherboard).

In accordance with some embodiments, as will be described in greater detail below in reference to FIGS. 4 and 5, an edge connector included in a dual-compact-form-factor expansion card (e.g., expansion card 100) may include a plurality (e.g., two or more) of pinouts, each disposed in a different portion of the edge connector. Each pinout may conform to a compact pinout specification. In some examples, a "pinout" may refer to a cross-reference between the contacts, or pins, of an electrical connector or electronic component, such as expansion card 100, as well as the functions of these contacts or pins. In some examples, a "pinout specification" may define an arrangement and/or configuration of pins for a particular application or interface.

In some embodiments, a "compact pinout specification" may define an arrangement and/or configuration of pins that may be more compact than a pinout that conforms to another pinout specification. By way of example, and without limitation, a compact pinout specification may specify that a pinout that conforms to the compact pinout specification may include, when compared to another pinout that conforms to the other pinout specification: (1) a narrower, thinner, or otherwise smaller width dimension; (2) a narrower, thinner, or otherwise smaller thickness dimension; (3) a closer pin pitch; and/or (4) narrower, thinner, or smaller pins. Additionally or alternatively, a compact pinout specification may specify that a pinout that conforms to the compact pinout specification may be smaller in any other manner or dimension than a pinout that conforms to another pinout specification. As will be described in greater detail below, a compact pinout specification may be included as part a compact expansion card specification that may specify parameters for a compact expansion card.

An example of a compact pinout specification may be a pinout specification included in a specification for M.2 cards. M.2 cards may have a set of 75 pin spaces, and this set of pin space may be 12 mm, 16 mm, 22 mm, or 30 mm wide. The pins may also have a length of 2.00 mm and a pitch of 0.5 mm. In contrast, the specification for a native PCI EXPRESS ×1 pinout may define a pitch of at least 1.0 mm, a width of at least 35 mm, and a length of at least 2.3 mm. Thus, an M.2 pinout, which may connect to a PCI EXPRESS bus, may be said to be more compact than a pinout defined by a specification for the PCI EXPRESS bus since at least one dimension of the M.2 pinout is smaller than the pinout defined by the specification for the PCI EXPRESS bus.

In one example, expansion card 100 may include a plurality of pinouts that may each conform to one or more mixed-pin pinout specifications. As used herein, the term "mixed-pin" generally refers to a pinout included in an expansion card that differs from a pinout of the specification of a computing bus to which the expansion card couples. In some examples, the expansion card may successfully couple with the computing bus, despite the conflict between the two pinouts, because the corresponding expansion socket may include one or more items of intermediary circuitry that effectively couples connections and/or translates data from the pinout included in the expansion card into a format accepted by the computing bus, and vice versa. Illustrative examples of mixed-pin specifications to which the pinout of the edge connector may conform may include, without limitation, an M.2 pinout specification, a U.2 pinout specification, and/or an mSATA pinout specification.

As detailed above, hardware accelerator 104 of expansion card 100 may be customized or special-purpose designed to perform, in hardware, one or more specific computing tasks. Illustrative examples of the types of specific computing tasks or applications that hardware accelerator 104 of expansion card 100 may execute or perform include, without limitation, artificial intelligence and/or machine learning training (e.g., model construction, inference, flasher labeling, etc.), video transcoding (e.g., converting video data from one encoded format to an intermediate uncompressed format and then converting the intermediate uncompressed format to another encoded format or target format), video processing (e.g., combining two or more video streams into a single video stream or a fewer number of video streams), data encryption/decryption, data compression/decompression, etc. In some examples, hardware accelerator 104 of expansion card 100 may be especially suited to, or beneficial for, the performance of specific types of mathematical operations, which may include multiply-accumulate operations, linear algebra operations, machine learning or vector tuning operations, and/or cryptographic prime number identification and/or verification operations. In general, hardware accelerator 104 of expansion card 100 may be customized or special-purpose designed to perform, in hardware, any type or form of computation-intensive computing task to thereby alleviate a burden on one or more general-purpose central processing units (i.e., by performing the computing task on a separate chip than the central processing unit and/or by performing the computing task more efficiently in hardware than in software).

As indicated above, in some examples, the computing task that application-specific hardware circuitry 106 of hardware accelerator 104 is designed to perform may include an artificial intelligence inference task that applies a model trained on known data to infer at least one label for new data. In some examples, an "artificial intelligence inference task that applies a model trained on known data" may include a process of applying a trained model to new data (e.g., making one or more predictions regarding the new data based on the model) rather than the process of generating, training, and/or tuning the model. In some examples, hardware accelerator 104 of expansion card 100 may effectively label one or more items of newly encountered, or newly analyzed, data with a label or attribute. In general, the model may be generated, trained, and/or tuned based on previously encountered data that was partially, or entirely, labeled, thereby enabling a machine learning algorithm to predict one or more labels for future data (e.g., by detecting patterns in the labels of the previously encountered data).

In some embodiments, the artificial intelligence inference task may include a user attribute inference task in the context of an online social networking system. In these examples, the user attribute may include an interest, a recommendation (e.g., an advertisement recommendation and/or a friend recommendation), and/or a push notification (e.g., a social network post selected for the user's newsfeed). In general, the artificial intelligence inference task may identify one or more of these labels or attributes for a user based on one or more items of data and/or metadata associated with the user, including the user's post history, post content, social media "likes" or response icon selections, friends list, message history, message content, and/or selected or clicked items such as including items and/or advertisements. In general, the artificial intelligence inference task may infer, or predict, that a user with one set of data or metadata will tend to share a label with another user having a similar or identical set of data or metadata (e.g., the strength of the prediction may be proportional to the similarity between the two users' items of data/metadata).

Hardware accelerator 104 may take a variety of forms. Illustrative examples of hardware accelerators include, without limitation, graphics processing units, cryptographic accelerators, video processing units, artificial intelligence accelerators, coprocessors, digital signal processors, and/or public key encryption accelerators. In some examples, hardware accelerator 104 may be implemented via an application specific integrated circuit (ASIC) and/or a field-programmable gate array (FPGA).

Figure 2:
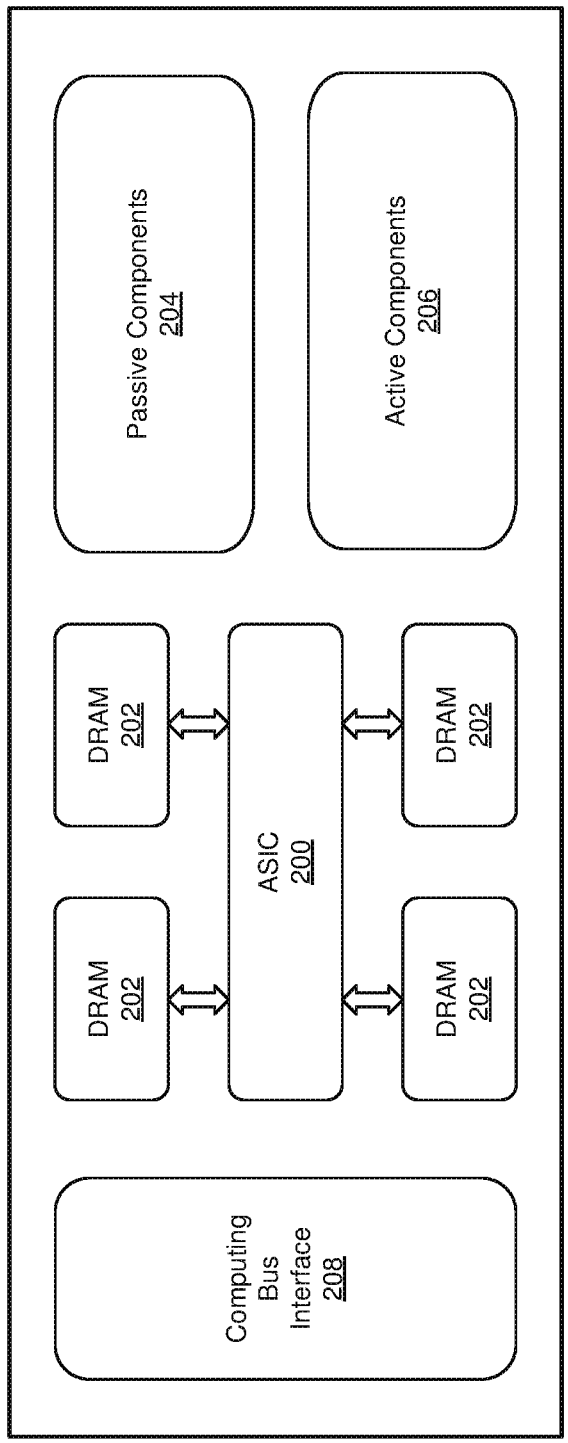
FIG. 2 is a more specific block diagram of an example expansion card capable of performing hardware acceleration.

FIG. 2 shows a block diagram of a more specific example of expansion card 100. As shown in this figure, expansion card 100 may include a hardware accelerator in the form of an ASIC 200. As further shown in this figure, expansion card 100 may also include one or more instances of dynamic random-access memory (DRAM) 202, each of which may be coupled to hardware accelerator 104. Expansion card 100 may also include one or more passive components 204, including resistors, capacitors, inductors, and/or transistors. Additionally, or alternatively, expansion card 100 may also include one or more active components 206. Each of the passive components and/or active components may be specifically designed and/or placed on expansion card 100 in a configuration that executes or performs (and/or enables ASIC 200 to perform), in hardware, the specific application in question, such as the video transcoding and/or artificial intelligence inference tasks described above. Lastly, expansion card 100 may also include a computing bus interface 208, such as a PCI EXPRESS interface, which may translate data formatted by ASIC 200 for transmission across the edge connector and/or the computing bus to which expansion card 100 may be coupled.

Figure 3:
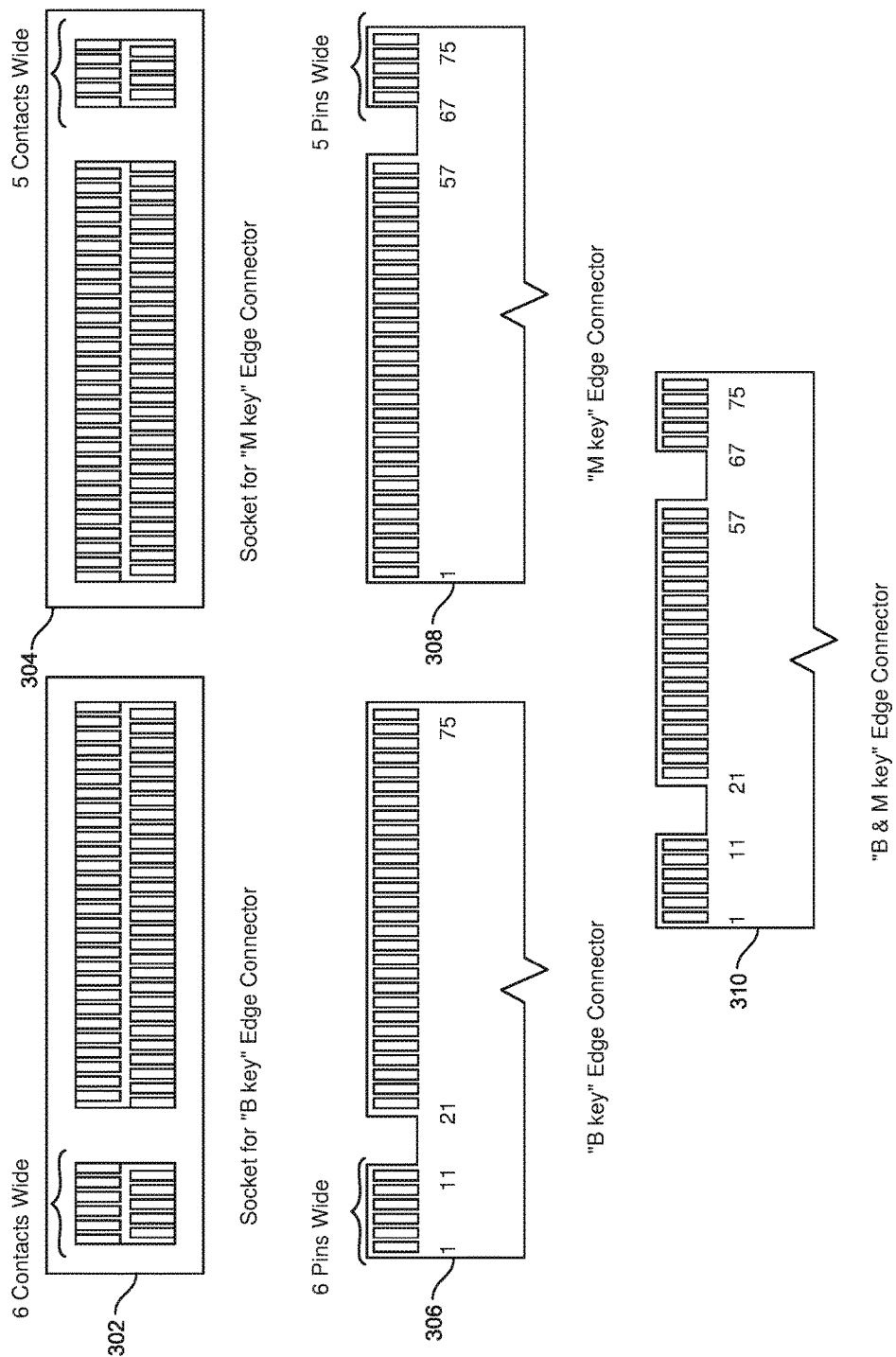
FIG. 3 is a set of block diagrams of various example compact pinouts that may be used by the expansion cards described herein.

As detailed above, edge connector 108 of expansion card 100 may include a plurality of pinouts, each disposed within a different portion (e.g., a distinct and/or separate linear portion) of edge connector 108. Each pinout may conform to one or more mixed-pin pinout specifications, such as the M.2 specification. FIG. 3 illustrates various examples of pinout configurations, conforming to the M.2 specification, that one or more pinouts included in edge connector 108 of expansion card 100 may utilize. In this figure, element 302 and element 304 illustrate pinouts for expansion sockets (e.g., slots included in expansion sockets) that conform to the "B key" and "M key" edge connector configurations of the M.2 specification. As such, in some embodiments, edge connector 108 of expansion card 100 from FIG. 1 may include pinouts for "B key" and "M key" edge connectors, as illustrated by element 306 and element 308 respectively, which may fit within corresponding M.2 expansion sockets as male connectors. Alternatively, one or more of the plurality of pinouts of the edge connector 108 of expansion card 100 may include pinouts that conform to the "B & M key" hybrid edge connector configuration of the M.2 specification, as illustrated by element 310. As further discussed above, each of these example pinouts may be more compact than the pinout specified by the PCI EXPRESS computing bus specification to which an M.2 expansion card may be coupled and over which an M.2 expansion card may communicate.

Figure 4:
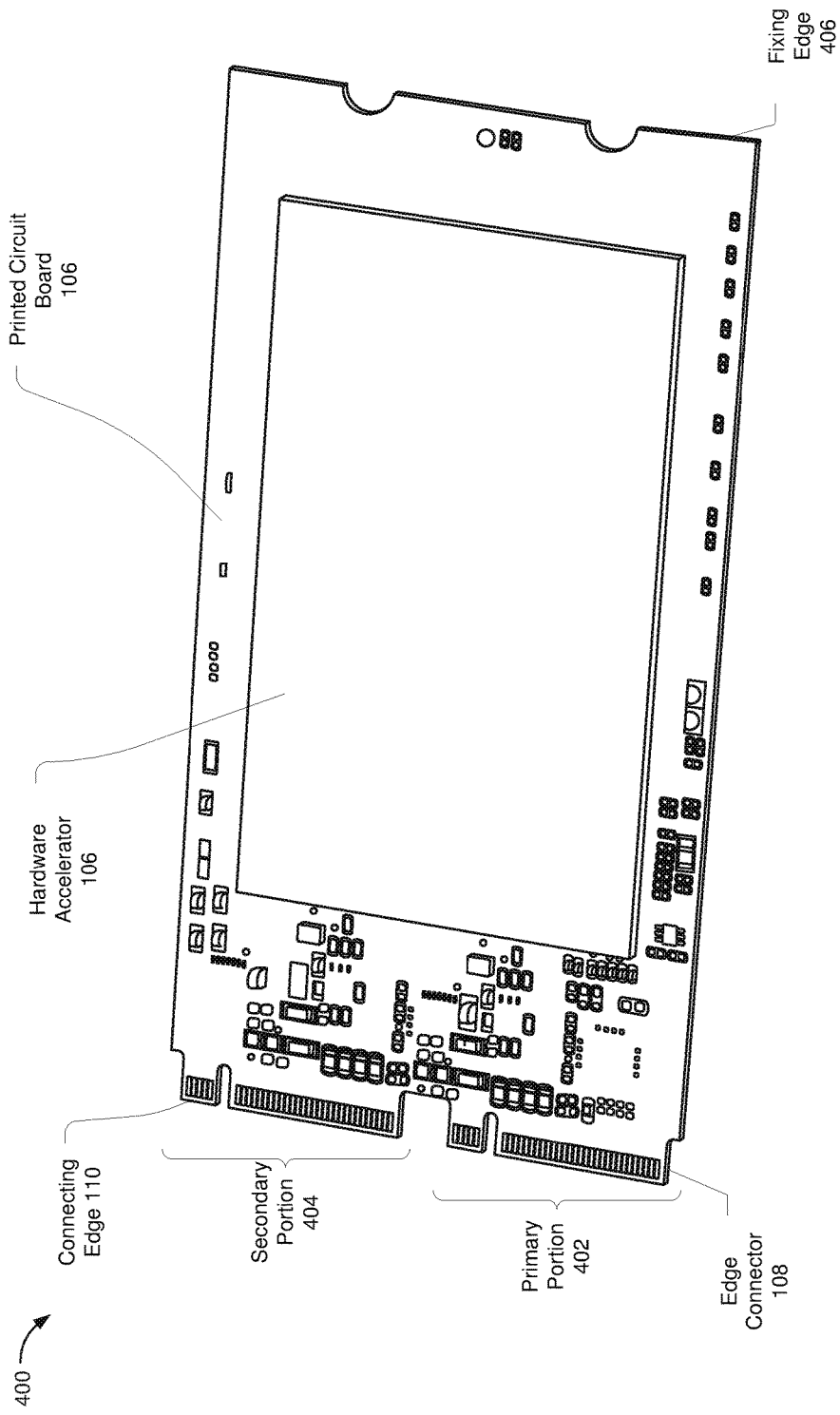
FIG. 4 is a perspective view of an example expansion card having a dual compact form factor.

FIG. 4 includes a perspective view 400 of an example expansion card 100 that includes an edge connector 108 and a hardware accelerator 104. Expansion card 100 may be formed in a variety of shapes and sizes. In one example, expansion card 100 may be substantially rectangular in shape, with an edge connector 108 disposed on a connecting edge 110 of printed circuit board 102 and a plurality of semicircular fixing notches (e.g., mounting holes) defined by a fixing edge 406 that may be an edge of printed circuit board 102 that may be opposite to connecting edge 110. As shown in this view, edge connector 108 may include a primary portion 402 and a secondary portion 404. In one embodiment, expansion card 100 may be dimensioned to be inserted into a corresponding expansion socket (such as expansion socket 602 in FIGS. 6A-6C) that may provide interfaces for a variety of computer buses, such as PCI EXPRESS 3.0 (up to, e.g., four lanes), SERIAL ATA 3.0, USB 3.0, and/or any other suitable interface.

Figure 5:
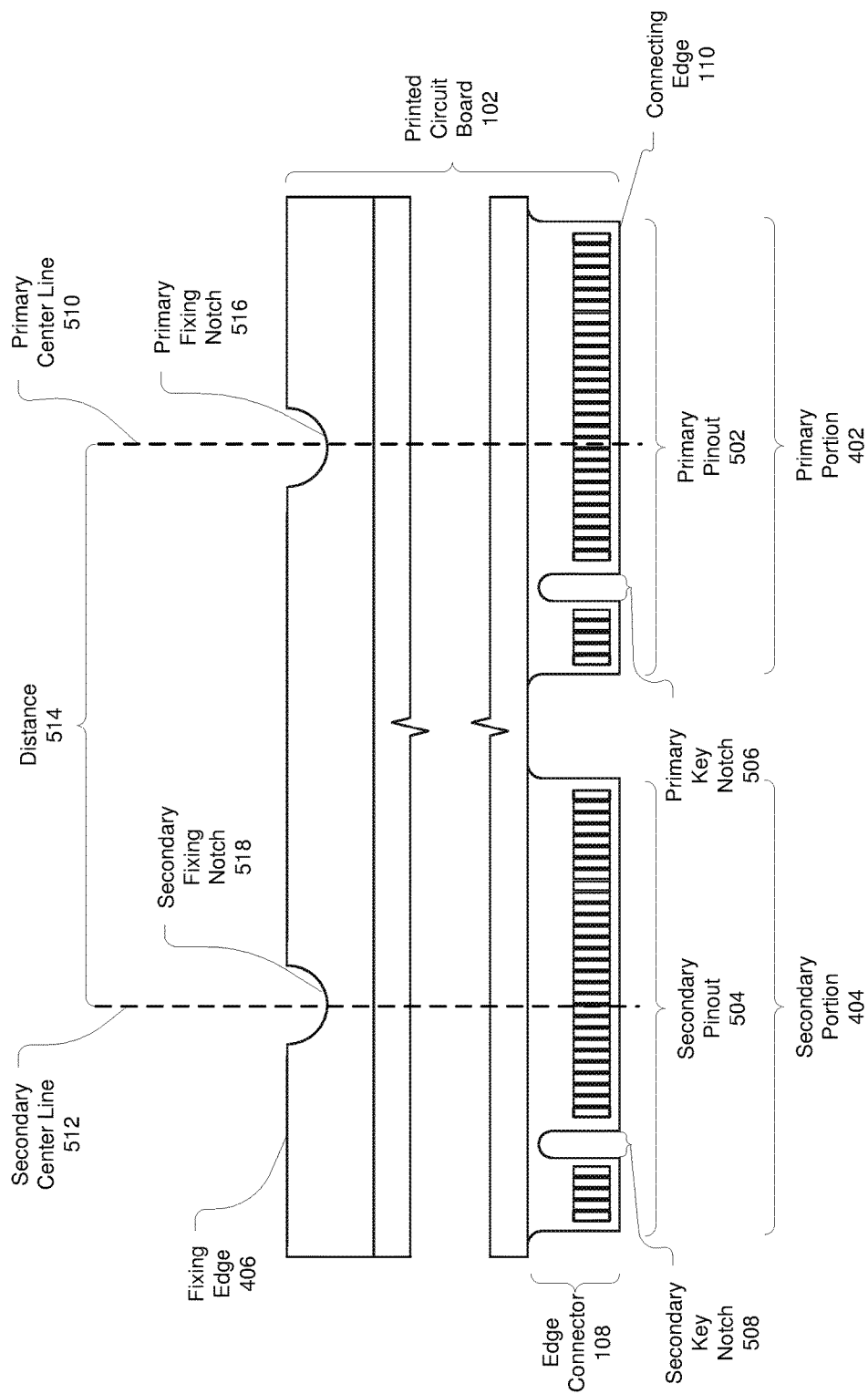
FIG. 5 is a detailed view of an example edge connector that may be included in an example dual-compact-form-factor expansion card, as well as a set of fixing notches that may also be included in the example dual-compact-form-factor expansion card.

FIG. 5 includes a detailed view of portions of expansion card 100. As shown, edge connector 108 may be disposed on connecting edge 110 of printed circuit board 102. As mentioned above, edge connector 108 may include a primary pinout 502 disposed within primary portion 402 of edge connector 108 and a secondary pinout 504 disposed within a secondary portion 404 of edge connector 108. Each of primary pinout 502 and secondary pinout 504 may include a respective set of connector traces that may conform to a compact pinout specification included in a compact expansion card specification.

For example, as shown in FIG. 5, each of primary pinout 502 and secondary pinout 504 may conform to a pinout specification included in an M.2 compact expansion card specification. Thus, each of primary pinout 502 and secondary pinout 504 may have a width of 19.85 mm and may include a 75-position pin arrangement with up to 67 pins spaced at a 0.50 mm pitch.

In some embodiments, primary portion 402 and/or secondary portion 404 of edge connector 108 may define one or more key notches that may correspond to key notches included in primary pinout 502 and/or secondary pinout 504. Key notches included in pinouts may denote various purposes and/or capabilities of each pinout and/or may prevent plugging of an expansion card (e.g., expansion card 100) into a feature-incompatible expansion socket. For example, as shown in FIG. 5, a primary portion of edge connector 108 that includes primary pinout 502 may define primary key notch 506 at pin positions 59-66 of primary pinout 502. Likewise, a secondary portion of edge connector 100 that includes secondary pinout 504 may define secondary key notch 508 at pin positions 59-66 of secondary pinout 506. Primary key notch 506 and/or secondary key notch 508 may therefore indicate that their corresponding pinouts (e.g., primary pinout 502 and/or secondary pinout 504) may conform to an "M-key" pinout specification included in an M.2 specification. Hence, each of primary pinout 502 and secondary pinout 504 may be dimensioned to be inserted into an expansion socket that includes a corresponding slot that, in accordance with an M.2 specification, is keyed for SATA or two PCI EXPRESS lanes (PCIe ×2) (according to a "socket 2 configuration") or keyed for four PCI EXPRESS lanes (PCIe ×4) (according to the "socket 3 configuration").

Although primary pinout 502 and secondary pinout 504 may each conform to the same compact pinout specification (e.g., an M-key specification included in an M.2 specification), in some examples, primary key notch 506 and secondary key notch 508 may vary in width. For example, primary key notch 506 may have a narrower width than secondary key notch 508. In at least one embodiment, primary key notch 506 may have a width of 1.2 mm, within a predefined manufacturing tolerance, and secondary key notch 508 may have a width of 1.4 mm, within the predefined manufacturing tolerance.

In some examples, the predefined manufacturing tolerance associated with a width of primary key notch 506 and/or a width of secondary key notch 508 may conform to a corresponding manufacturing tolerance that may be included in a compact expansion card specification. For example, an M.2 specification may include a manufacturing tolerance, for a key notch included in an M-key pinout specification, of within 0.05 mm (also denoted as "±0.5 mm"). Thus, in at least one example, primary key notch 506 may have a width of 1.2 mm±0.05 mm and secondary key notch 508 may have a width of 1.4 mm±0.05 mm.

Such keying features may enable primary key notch 506, rather than secondary key notch 508, to drive an alignment and/or insertion operation of expansion card 100 into a suitably configured expansion socket (e.g., a suitably configured dual-compact-form-factor expansion socket). As primary key notch 506 may be located closer to a lateral center line of expansion card 100, this feature, in combination with other features disclosed herein, may reduce a probability that any portion of edge connector 108 may be damaged during the alignment and/or insertion operation.

As mentioned above, each of primary pinout 502 and secondary pinout 504 may include a respective set of connector traces. In some examples, each connector trace included in these sets of connector traces may be manufactured in accordance with manufacturing tolerances that meet or exceed tolerance specifications included in a corresponding compact expansion card specification. For example, each connector trace may be manufactured in accordance with a target routing tolerance that is narrower (e.g., manufactured according to a more accurate routing tolerance measurement) than a routing tolerance specification included in the corresponding compact expansion card specification. Additionally, in some examples, each connector trace may be manufactured in accordance with a target true position that is narrower than a corresponding true position specification included in the corresponding compact expansion card specification.

By way of illustration, as mentioned above, each of primary pinout 502 and secondary pinout 504 may conform to an M-key pinout specification included in a M.2 specification. The M.2 specification may specify a routing tolerance and a true position for connector traces of ±0.1 mm and ±0.15 mm, respectively. However, the connector traces included in primary pinout 502 and secondary pinout 504 may be manufactured in accordance with a target routing tolerance of ±0.05 mm and a target true position of ±0.12 mm. This may enable edge connector 108 to retain all pins available in both primary pinout 502 and secondary pinout 504, and may reduce a possibility that any pin may have less than 50% overlap with a corresponding contact in a suitably configured expansion socket (e.g., a dual-compact-form-factor expansion socket). This may ensure no loss in functionality and/or electrical reliability for the expansion socket, which may, as will be discussed in greater detail below, be configured to receive either (1) one dual-compact-form-factor expansion card (e.g., expansion card 100) or (2) two or more conventional compact expansion cards.

Note that the pinouts described above, as well as the pinouts shown in FIGS. 3, 4, and 5, are merely illustrative. The following table provides a more detailed overview of potential keying and provided interfaces that each portion of edge connector 108 included in expansion card 100 (e.g., primary portion 402 and/or secondary portion 404) may utilize:

| Key ID | ID Notched Pins | Provided Interfaces |
| --- | --- | --- |
| A | 8-15 | PCIe ×2, USB 2.0, I2C, and DP ×4 |
| B | 12-19 | PCIe ×2, SATA, USB 2.0, and 3.0, audio, UIM, HSIC, SSIC, I2C, and SMBus |
| C | 16-23 | Reserved for future use |
| D | 20-27 | Reserved for future use |
| E | 24-31 | PCIe ×2, USB 2.0, I2C, SDIO, UART, and PCM "WiFi/Bluetooth cards" |
| F | 28-35 | Future Memory Interface (FMI) |
| G | 39-46 | Reserved for custom use (unused in the M.2 specification) |
| H | 43-50 | Reserved for future use |
| J | 47-54 | Reserved for future use |
| K | 51-58 | Reserved for future use |
| L | 55-62 | Reserved for future use |
| M | 59-66 | PCIe ×4, SATA, and SMBus |

In some embodiments, a printed circuit board included in a dual-compact-form-factor expansion card (e.g., printed circuit board 102) may have dimensions that may be related to one or more corresponding dimensional specifications included in a compact expansion card specification. For example, as described above, primary pinout 502 and secondary pinout 504 may conform to an M-key pinout specification included in an M.2 specification. Such an M.2 specification may specify that a printed circuit board that conforms to the M.2 specification may have a length dimension of 16, 26, 30, 38, 42, 60, 80, or 110 mm. Therefore, a printed circuit board included in a dual-compact-form-factor expansion card may also have a length dimension of 16, 26, 30, 38, 42, 60, 80, or 110 mm. As an example, printed circuit board 102 included in expansion card 100 may have a length dimension of 110 mm.

Additionally, printed circuit board 102 may also have a width dimension that may include a multiple of a width specification included in a compact expansion card specification as well as a predefined buffer distance. For example, the M.2 specification may specify that a compact expansion card that conforms to the M.2 specification may have a width of 12, 16, 22, or 30 mm. For each pinout included in edge connector 108, a width dimension of printed circuit board 102 may include one of 12 mm, 16 mm, 22 mm, or 30 mm. Furthermore, the width dimension of printed circuit board 102 may also include a predefined buffer distance that may serve to further separate primary pinout 502 from secondary pinout 504. For example, a predefined buffer distance may be 2 mm.

To illustrate, suppose that each of primary pinout 502 and secondary pinout 504 each conform to an M-key pinout specification included in an M.2 specification, and the predefined buffer distance may be 2 mm. Thus, in such an example, a width dimension of printed circuit board 102 may be 22 mm/pinout×2 pinouts+2 mm=46 mm.

In some embodiments, printed circuit board 102 may be manufactured to have certain dimensions within a predefined manufacturing tolerance. In some examples, the predefined manufacturing tolerance may be related to a corresponding manufacturing tolerance included in a compact expansion card specification. For example, an M.2 specification may specify that a printed circuit board that conforms to the M.2 specification may have a width dimension of 22 mm±0.15 mm and/or a length dimension of 110 mm±0.15 mm. Hence, a predetermined manufacturing tolerance of a width dimension and/or a length dimension of printed circuit board 102 may be ±0.15 mm. Hence, continuing with the previous example, in at least one embodiment, printed circuit board 102 may be manufactured in accordance with a width dimension of 46 mm±0.15 mm and a length dimension of 110 mm±0.15 mm.

Furthermore, primary portion 402 and secondary portion 404 of edge connector 108 may be disposed (e.g., positioned, located, arranged, etc.) along edge connector 108 such that a lateral center line of primary portion 402 is disposed a predefined distance from a lateral center line of the secondary portion of the edge connector. For example, as shown in FIG. 5, primary center line 510 illustrates a lateral center line of primary portion 402 of edge connector 108 and secondary center line 512 illustrates a lateral center line of secondary portion 404 of edge connector 108. Distance 514 may indicate a distance from secondary center line 512 to primary center line 510. Distance 514 may represent any suitable predefined distance. For example, in at least one embodiment, distance 514 may be 22.5 mm±0.15 mm. In some examples, distance 514 may be referred to as a "pitch" or "pitch spacing" of a dual-compact-form-factor expansion card. Furthermore, this pitch spacing may comport with the width dimensions and/or predefined buffer distances of printed circuit board 102 as described above.

Additionally, a dual-compact-form-factor expansion card (e.g., expansion card 100) may conform to a component thickness specification included in a compact expansion card specification. The following table may indicate potential component thicknesses for expansion card 100:

| Type ID | Top Side | Bottom Side |
|---|---|---|
| S1 | 1.20 mm | N/A |
| S2 | 1.35 mm | N/A |
| S3 | 1.50 mm | N/A |
| D1 | 1.20 mm | 1.35 mm |
| D2 | 1.35 mm | 1.35 mm |
| D3 | 1.50 mm | 1.35 mm |
| D4 | 1.50 mm | 0.70 mm |
| D5 | 1.50 mm | 1.50 mm |

As mentioned above, printed circuit board 102 may also include a fixing edge 406 that may be opposite to a connecting edge of printed circuit board 102 (e.g., connecting edge 110). Fixing edge 406 may define a plurality of fixing notches through which screws may be inserted to secure expansion card 100 when expansion card 100 has been inserted into a suitably configured expansion socket. In some examples, each fixing notch included in the plurality of fixing notches may be included in and/or may be connected to a grounding pad that may provide a grounding point for one or more components included in expansion card 100.

Additionally, each fixing notch defined by fixing edge 406 may be centrally aligned with a center point of a corresponding pinout included in edge connector 108. For example, as shown in FIG. 5, fixing edge 406 may define primary fixing notch 516 and secondary fixing notch 518. Primary fixing notch 516 is centrally aligned with primary center line 510 that illustrates a lateral center line of primary portion 402 of edge connector 108. Likewise, secondary fixing notch 518 is centrally aligned with secondary center line 512 that defines a lateral center line of secondary portion 404 of edge connector 108.

Figure 6A:
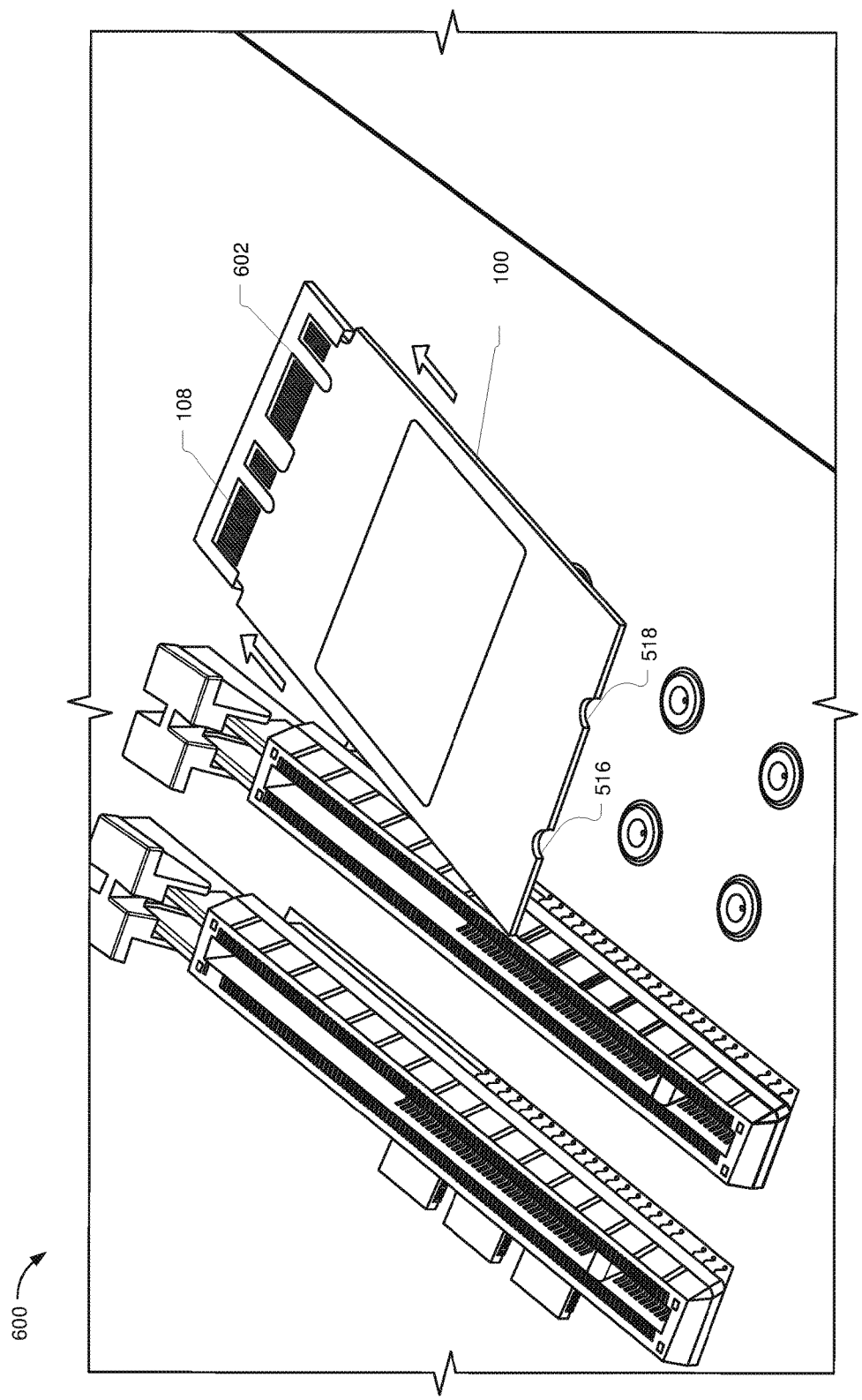
FIG. 6A is a perspective view of an initial stage of a process for inserting an example dual-compact-form-factor expansion card into a corresponding dual-compact-form-factor expansion socket.
Figure 6B:
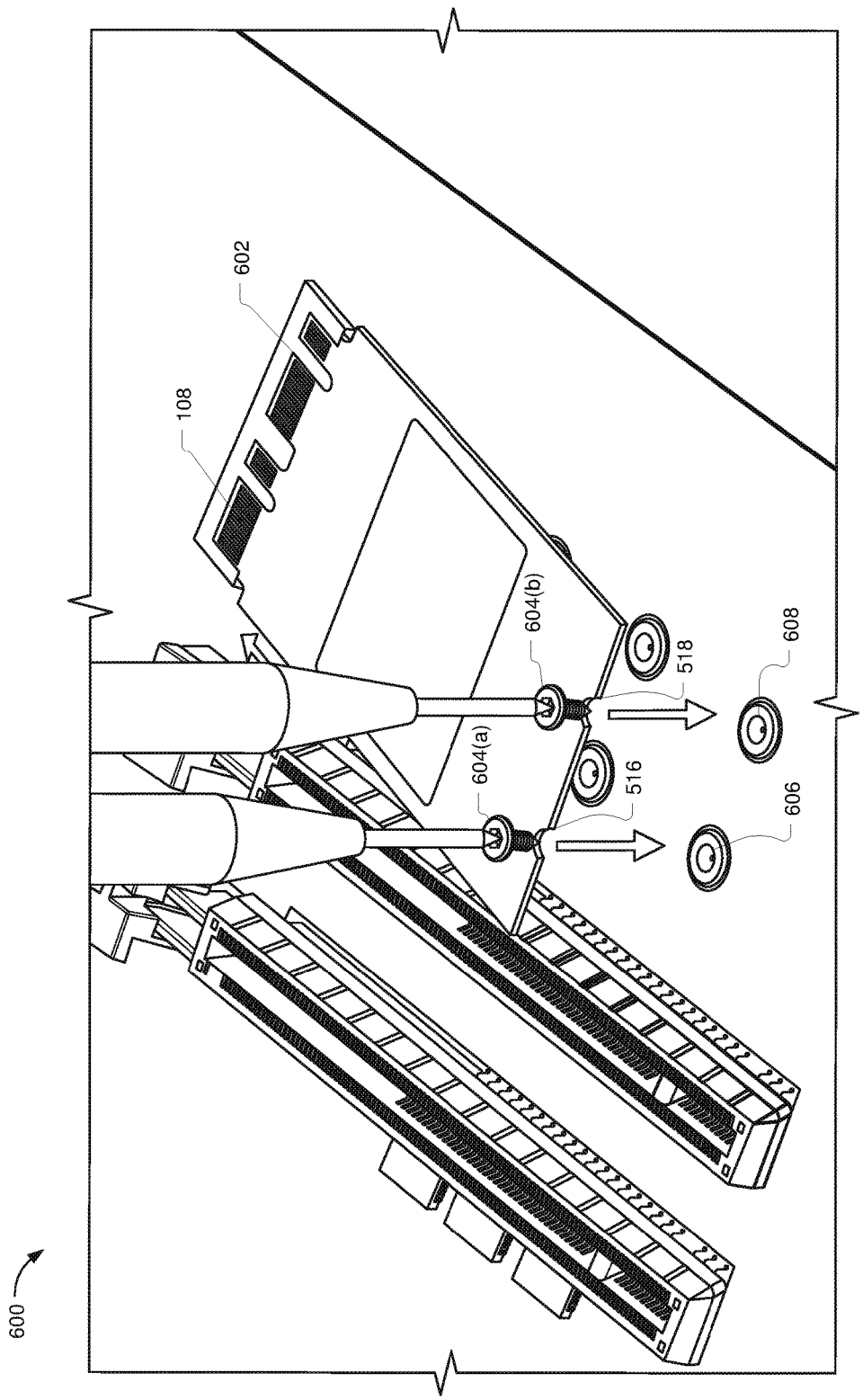
FIG. 6B is a perspective view of an intermediate stage of the process for inserting the example dual-compact-form-factor expansion card into the corresponding dual-compact-form-factor expansion socket.
Figure 6C:
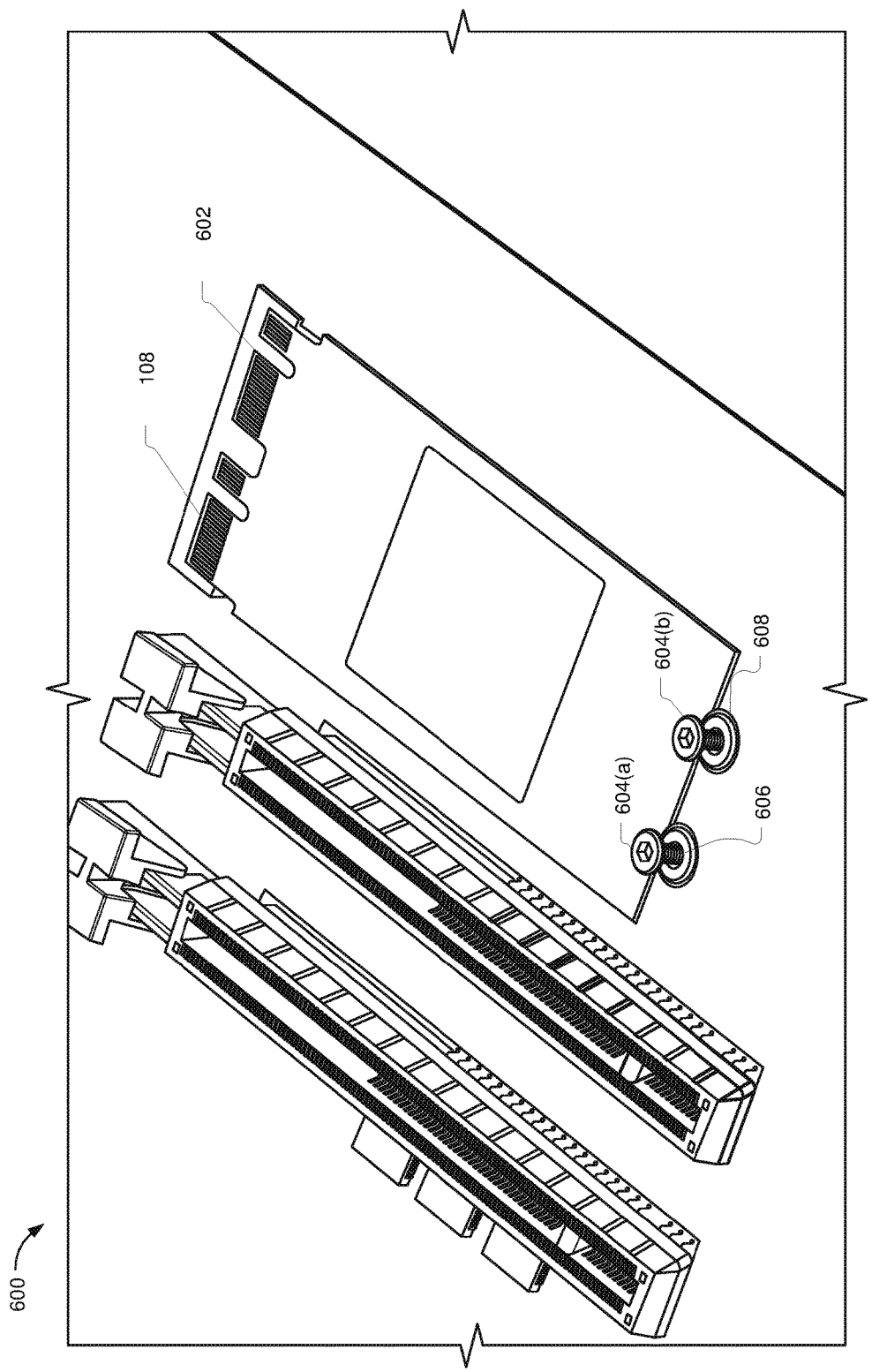
FIG. 6C is a perspective view of a concluding stage of the process for inserting the example dual-compact-form-factor expansion card into the corresponding dual-compact-form-factor expansion socket.

As detailed above, expansion card 100 may be dimensioned to be inserted into a corresponding expansion socket provided by a host circuit board. FIGS. 6A-6C illustrate three separate stages (i.e., beginning, middle, and ending) of a process for inserting, or coupling, an expansion card 100 with a corresponding expansion socket 602 on a motherboard 600. As shown in FIG. 6A, a user or machine may first align edge connector 108 of expansion card 100 with expansion socket 602. The user or machine may then push expansion card 100 such that edge connector 108 fits within expansion socket 602. Next, as shown in FIG. 6B, the user or machine may align screw 604(a) with primary fixing notch 516 and then twist screw 604(a) through primary fixing notch 516 and into a corresponding primary screw hole 606 beside expansion socket 602. As further shown in FIG. 6B, the user or machine may also align screw 604(b) with secondary fixing notch 518 and then twist screw 604(b) through secondary fixing notch 518 and into a corresponding secondary screw hole 608 beside expansion socket 602. Thus, a user or machine may fasten expansion card 100 into expansion socket 602. FIG. 6C illustrates an example of the final position of expansion card 100 after the fastening process is complete.

In some examples, an expansion socket that may be configured to receive edge connector 108 may include a plurality of slots, with each slot dimensioned to receive a respective pinout of edge connector 108 and configured to electrically couple a respective portion of edge connector 108 to a central processing unit via the respective pinout while the respective portion of edge connector 108 is inserted into the slot. Such an expansion socket may be referred to as a "dual-compact-form-factor expansion socket" and may provide, to each respective portion of edge connector 108, an identical array of power and/or data transfer resources as may be provided by a traditional compact-form-factor expansion socket to a traditional compact-form-factor expansion card that also conforms to the compact pinout specification of the respective portion of edge connector 108.

An example dual-compact-form-factor expansion socket may include a primary slot and a secondary slot. Each of the primary slot and the secondary slot may be configured to respectively receive primary pinout 502 within the primary slot and secondary pinout 504 within the secondary slot. As primary pinout 502 and secondary pinout 504 conform to an M-key pinout specification included in a M.2 specification, each of the primary slot and the secondary slot may be configured to provide an array of resources corresponding to the M-key pinout specification included in the M.2 specification to expansion card 100 via a respective pinout.

For example, when primary pinout 502 is inserted into a primary slot of a dual-compact-form-factor expansion socket, the primary slot may expose a variety of buses to expansion card 100 via primary pinout 502, including PCI EXPRESS 3.0, Serial ATA (SATA) 3.0, and USB 3.0. As a result, expansion card 100 may, when primary pinout 502 is inserted into the primary slot of the dual-compact-form-factor expansion socket, integrate a variety of functions in addition to hardware acceleration, including the following device classes: WI-FI, BLUETOOTH, satellite navigation, NEAR FIELD COMMUNICATION (NFC), digital radio, WIRELESS GIGABIT (WiGig), wireless WAN (WWAN), and solid-state drives (SSDs).

In other examples, when primary pinout 502 is inserted into the primary slot of the dual-compact-form-factor expansion socket, the socket may provide to expansion card 100, via primary pinout 502, up to four PCI EXPRESS lanes and one logical SATA 3.0 (6 Gbit/s) port, exposing the same through the same connector so that both PCI EXPRESS and SATA devices may exist on expansion card 100. By exposing PCI EXPRESS lanes in this manner, the dual-compact-form-factor expansion socket may provide a pure PCI EXPRESS connection between the host computing device and expansion card 100 via primary pinout 502, with no additional layers of bus abstraction.

Similarly, in addition to supporting legacy Advanced Host Controller Interface (AHCI) at the logical interface level, each slot included in in the dual-compact-form-factor expansion slot may also support NVM EXPRESS (NVMe) as a logical device interface. While the support for AHCI may ensure software-level backward compatibility with legacy SATA devices and legacy operating systems, NVM EXPRESS may also enable expansion card 100, when primary pinout 502 may be inserted into the primary slot, to fully utilize the capability of high-speed PCI EXPRESS devices to perform many I/O operations in parallel.

Additionally, the dual-compact-form-factor expansion socket may be configured to receive, instead of a dual-compact-form-factor expansion card (e.g., expansion card 100), up to one traditional compact-form-factor expansion card (e.g., an M.2 expansion card) within each of the primary slot and the secondary slot, and may provide any of the above-described resources to each received traditional compact-form-factor expansion card. Thus, a dual-compact-form-factor expansion socket may integrate one dual-compact-form-factor expansion card (e.g., expansion card 100) or a corresponding number (e.g., 2) of traditional compact-form-factor expansion cards into a computing device and/or system.

In some examples, expansion card 100 may aggregate resources provided via separate slots included in a dual-compact-form-factor expansion socket in order to accommodate components that may require more resources than may be provided via a single slot or a traditional compact-form-factor expansion socket (e.g., an M.2 expansion socket). For example, a traditional M.2 expansion socket may provide 3.3 volts to a traditional M.2 expansion card, and an example hardware accelerator may require 6 volts to function. The voltage provided by the traditional M.2 expansion socket would be insufficient for the example hardware accelerator. However, if such an example hardware accelerator were included in expansion card 100, expansion card 100 could receive 3.3 volts from each of the primary slot via primary pinout 502 and 3.3 volts from the secondary slot via secondary pinout 504. Expansion card 100 could then aggregate the received voltages for an aggregated total voltage of up to 6.6 volts, which may be sufficient for the example hardware accelerator to function. Similarly, expansion card 100 may additionally or alternatively aggregate bandwidth resources provided and/or exposed to expansion card 100 by separate slots included in the dual-compact-form-factor expansion socket.

In some examples, expansion card 100 may constitute one part of a larger system. For example, expansion card 100 may be inserted into an expansion socket of a computing device that represents, either alone or in combination with other computing devices or components, part of a larger system. In some examples, this computing device may include a central processing unit. In these examples, expansion card 100 may ameliorate a burden on the central processing unit of the computing device by executing, in hardware, the specific application in question rather than the central processing unit executing the specific application in software, as outlined above. In some examples, the computing device may also include a memory device, which may provide a location for storing and loading corresponding software.

In some alternative examples, the computing device into which expansion card 100 is inserted may not include a conventional central processing unit. For example, this computing device may simply include a chassis that houses a rack of trays, dimensioned to receive printed circuit boards, and one or more of the printed circuit boards may include a hardware accelerator, such as hardware accelerator 104. The computing device may then provide results from the hardware accelerator across a network to which the computing device is connected. Additionally, in some examples, the hardware accelerator may effectively replace a central processing unit or coprocessor that was previously inserted into the computing device.

In general, the computing device of the above-described system may correspond to one of a variety of different devices, such as laptops, desktops, servers, etc. In examples where the computing device represents a server, the computing device may be disposed, or located, within a data center, which may provide computational resources to users, clients, or other servers across a computing network (e.g., a wide area network). For example, the above-described system may represent a backend data center of a corporate networking enterprise that provides at least one online service to corresponding users of client devices. This online service may include a social networking service, a virtual reality service, and/or a cloud storage service. In the context of a social networking service, the specific application performed by hardware accelerator 104 may include any of the specific computing tasks described above, such as artificial intelligence inference tasks (e.g., applying a machine learning model to predict a post, interest, friend, recommendation, and/or advertisement for a user) and/or video transcoding (e.g., encoding and/or decoding) operations.

In one specific example, the computing device into which expansion card 100 is inserted may represent a domain controller server and/or an edge server. As used herein, the term "domain controller" generally refers to a server that manages a unified collection of computing resources. Additionally, the term "domain controller" may refer to a main server or primary server of a technology company data center, which may be prioritized for the processing of one or more computing tasks. In addition, as used herein, the term "edge server" generally refers to a server that resides on the "edge" between two networks. In some illustrative examples, the edge server may reside between a private network and the Internet. In some examples, an "edge server" may refer to a computing device that has fewer computing resources and/or lower computational processing power than a domain controller or main/primary server. In some examples, it may be impractical or impossible for an edge server to perform a computationally expensive computing task, such as an artificial intelligence inference task and/or a video transcoding task, without executing the computing task through a hardware accelerator, such as hardware accelerator 104 on expansion card 100, as discussed above. In other words, inserting a hardware accelerator card, such as expansion card 100, into an edge server may enable the edge server to perform the complex computational task, thereby converting the edge server from a system that is unable to efficiently or effectively perform a complex task into a system that is able to reliably handle the complex task.

In some embodiments, the computing device into which expansion card 100 is inserted may represent a multi-node compute platform. In one example, this multi-node compute platform may include a sled, which may further include one or more modular computing devices (such as a server card or a storage carrier card). In this example, one or more of the server or carrier cards may include at least one expansion socket that is dimensioned to accept expansion card 100 and to be repurposed for hardware acceleration, as discussed further below.

Figure 7:
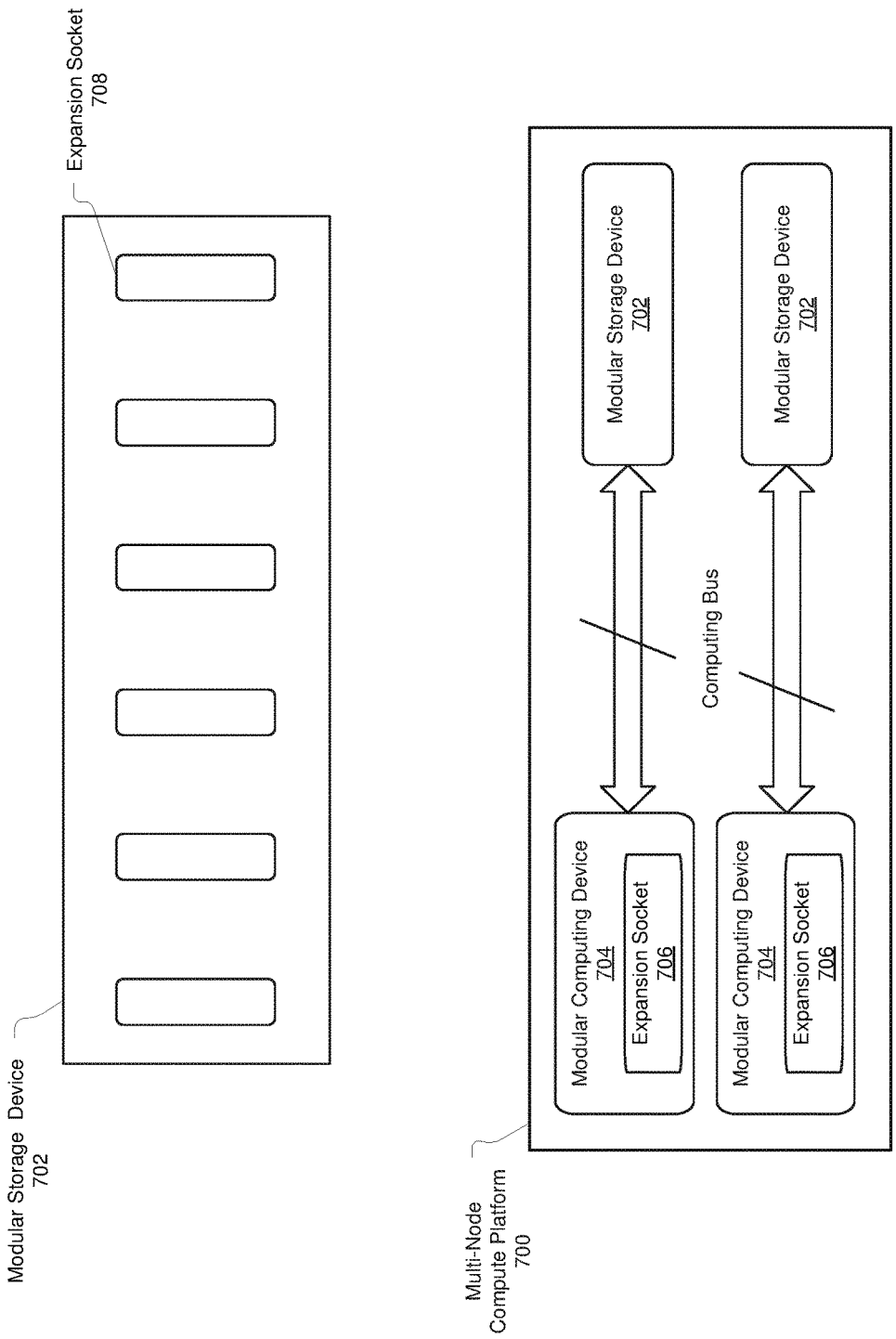
FIG. 7 is a block diagram of an example multi-node compute platform on which the dual-compact-form-factor expansion cards described herein may be deployed.

FIG. 7 is a block diagram of an exemplary multi-node compute platform 700 that may be partially or entirely repurposed for hardware acceleration. As shown in FIG. 7, multi-node compute platform 700 may be configured with several bays, each of which may house a modular storage device 702 (e.g., an SSD carrier card or a device carrier card), a modular computing device 704 (e.g., a micro-server card), and/or any other suitable type or form of modular node. While FIG. 7 shows multi-node compute platform 700 with four bays, multi-node compute platforms may include any other number of bays.

Repurposing a multi-node compute platform for hardware acceleration may involve inserting one or more hardware accelerator expansion cards, such as expansion card 100, into a suitably configured expansion slot within the multi-node compute platform. In the example shown in FIG. 7, hardware-accelerator expansion cards (such as expansion card 100) may be inserted into either or both of expansion sockets 706 of modular computing devices 704. Additionally or alternatively, hardware-accelerator expansion cards may be inserted into one or more of expansion sockets 708 in either or both of modular storage devices 702.

By using dual-compact-form-factor expansion cards for hardware acceleration, embodiments of the instant disclosure may supplement multi-node compute platform 700 with hardware acceleration functionality. Furthermore, dual-compact-form-factor expansion cards as disclosed herein may provide increased resources to hardware accelerators disposed thereon versus traditional compact-form-factor expansion cards, and may therefore provide improved hardware acceleration functionality over such traditional compact-form-factor expansion cards. As such, the disclosed systems and methods may enable a data center administrator or automation system to efficiently scale the ability of a multi-node compute platform to handle computationally expensive computing tasks by simply inserting and enabling one or more hardware-acceleration expansion cards into appropriately configured expansion sockets within the multi-node compute platform.

Figure 8:
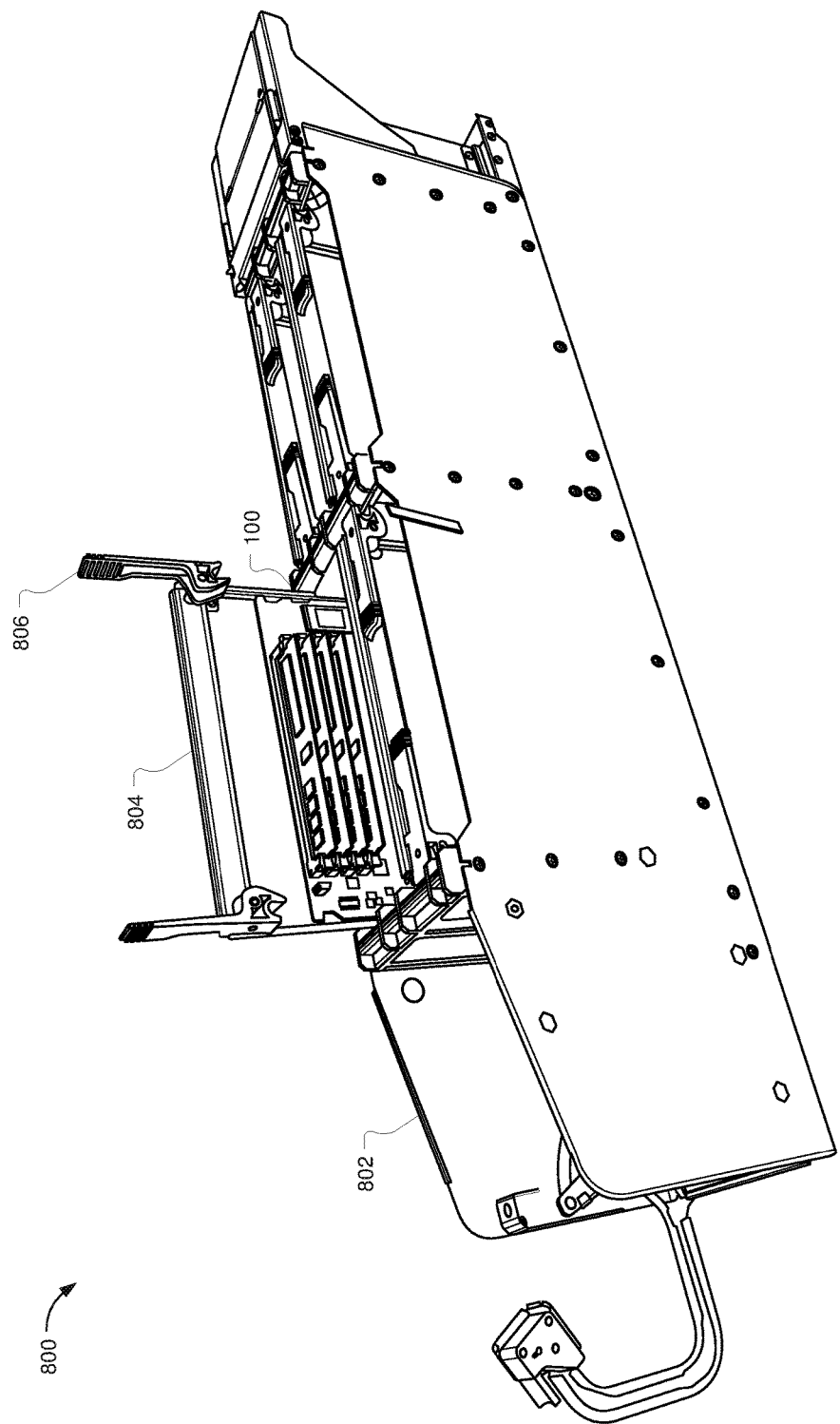
FIG. 8 is a perspective view of an example multi-node compute platform sled capable of housing the dual-compact-form-factor expansion cards described herein.

As noted above and illustrated in FIG. 10, a multi-node compute platform 800 may be dimensioned to accept modular computing devices on one or more sleds, such as sled 802 in FIG. 8. In this example, sled 802 may include several bays or slots for accepting corresponding trays 804, each of which may include a modular computing device (e.g., a server card) or a modular storage device (e.g., a carrier or device card, such as an SSD card). As shown in this figure, sled 802 may include four separate slots for accepting corresponding trays 804. Each tray 804 may include at least one fastening mechanism 806. FIG. 8 further illustrates how each tray 804 may hold a modular computing device and/or modular storage device, each of which may include at least one expansion socket into which expansion card 100 may be inserted.

Figure 9:
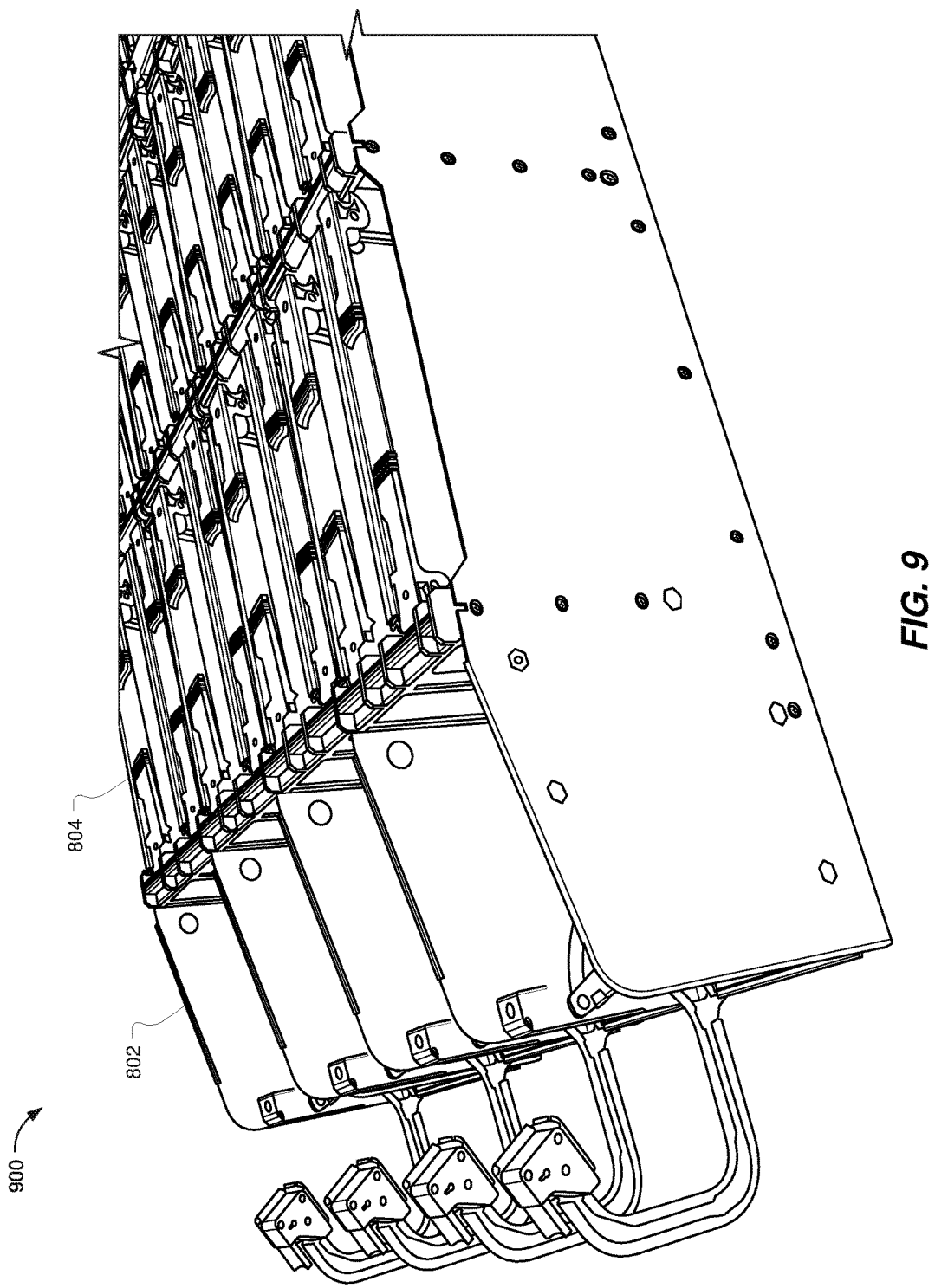
FIG. 9 is a perspective view of an example chassis capable of housing various multi-node compute platform sleds on which the dual-compact-form-factor expansion cards described herein may be deployed.

FIG. 9 is a perspective drawing of an expanded multi-node compute platform 900. As shown in this figure, platform 900 may include a set of sleds, such as sled 802, each of which may accept multiple trays 804 containing modular computing and/or storage devices. By including dual-compact-form-factor expansion cards that include hardware accelerators in these devices, the disclosed systems and methods may facilitate dramatically improved data center scaling (e.g., scaling that may not involve adding expensive servers and/or that may not require additional space in a data center) for computationally expensive computing tasks. More specifically, data center administrators may conveniently scale hardware acceleration resources for complex tasks, such as artificial intelligence inference operations and/or video transcoding operations, by (i) adding one or more expansion cards, such as expansion card 100, to a single tray (such as tray 804) that houses a modular computing and/or storage device, (ii) adding additional trays of modular computing or storage devices to a sled (such as sled 802), each of which may include one or more instances of expansion card 100, (iii) adding additional sleds (such as sled 802) to a chassis, each of which may contain additional instances of expansion card 100, and/or (iv) adding additional chasses and/or server racks, each of which may accept multiple sleds that contain additional instances of expansion card 100.

In this manner, the disclosed systems and methods may repurpose or reengineer a multi-node compute platform, and more specifically may reengineer a modular computing and/or storage device, which previously may have been used exclusively for mass storage via solid-state drives, to supplement the platform with one or more hardware accelerators. Multi-node compute platforms that are configured in this manner may benefit from the granular scalability provided by dual-compact-form-factor expansion cards that include hardware accelerators. Additionally, the form factor of dual-compact-form-factor expansion cards may enable a larger number of expansion sockets within the same surface area in comparison to a traditional expansion card such as a PCI EXPRESS expansion card.

Figure 10:
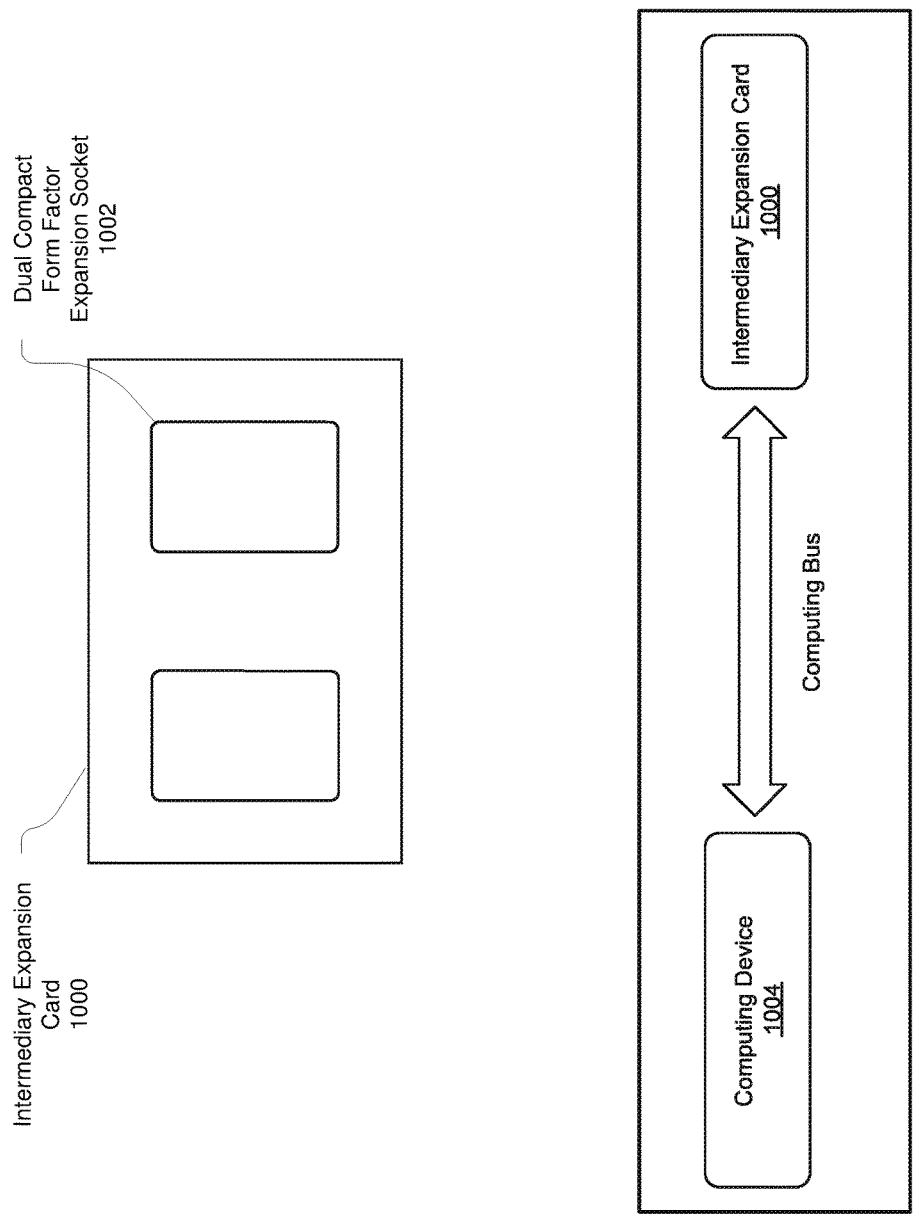
FIG. 10 is a block diagram of an example intermediary expansion card on which the dual-compact-form-factor expansion cards described herein may be deployed.

In some examples, the expansion socket into which expansion card 100 is inserted may be disposed on an intermediary expansion card. In some examples, an "intermediary expansion card" may refer to any expansion card that includes at least one expansion socket dimensioned to accept an additional expansion card in a nested fashion, as discussed further below. As shown in FIG. 10, an exemplary intermediary expansion card 1000 may include two or more separate dual-compact-form-factor expansion sockets 1002, each of which may be dimensioned to each accept an instance of expansion card 100. In the specific example of FIG. 10, intermediary expansion card 1000 may include two separate expansion sockets that may each accept an instance of expansion card 100. The specific number of expansion sockets is merely illustrative, and other examples of intermediary expansion card 1000 may include a fewer or greater number of expansion sockets.

In some examples, intermediary expansion card 1000 may include an edge connector having a pinout that conforms to a pinout specification defined for a computing bus to which intermediary expansion card 1000 is designed to be connected. For example, the pinout of the edge connector of intermediary expansion card 1000 may conform to the PCI EXPRESS specification. Thus, when the edge connector of intermediary expansion card 1000 is inserted into a PCI EXPRESS expansion socket on a computing device (such as computing device 1004), intermediary expansion card 1000 may be coupled to the PCI EXPRESS computing bus of the computing device.

In contrast, expansion card 100, which may be dimensioned to be inserted into dual-compact-form-factor expansion socket 1002 of intermediary expansion card 1000, may include an edge connector 108 that includes a plurality of pinouts that each conform to a compact pinout specification that is more compact than a pinout specification defined for the computing bus to which intermediary expansion card 1000 is connected. For example, a primary pinout and/or a secondary pinout included in edge connector 108 of expansion card 100 may conform to a pinout specification defined for the M.2 standard, which is more compact than the pinout specification defined by the PCI EXPRESS standard, such that each pinout included in edge connector 108 of expansion card 100 may be more compact than the pinout specification of the computing bus (i.e., the PCI EXPRESS computing bus) to which expansion card 100 is ultimately connected (via intermediary expansion card 1000).

Figure 11:
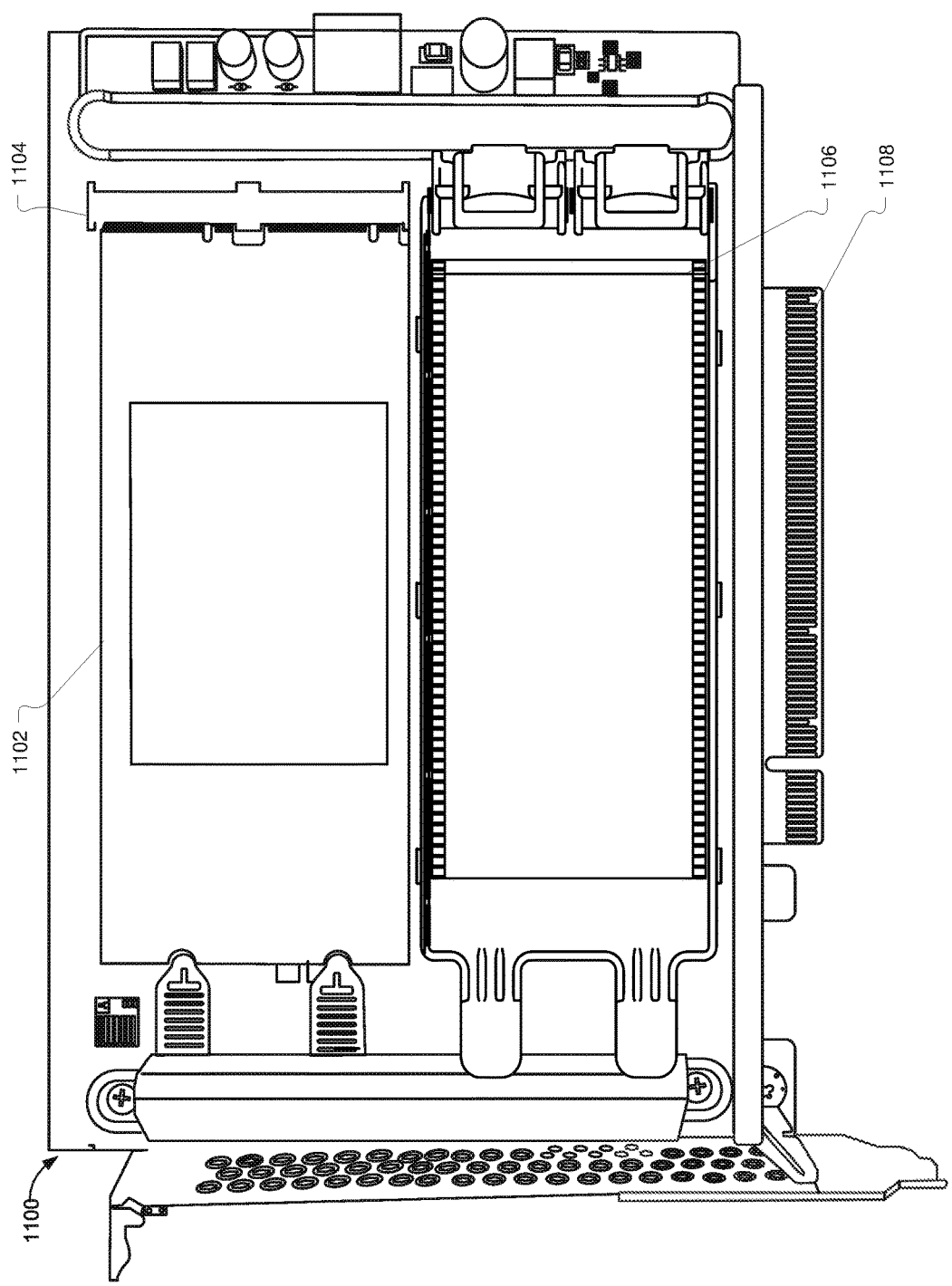
FIG. 11 is a plan view of an example intermediary expansion card that includes an example dual-compact-form-factor expansion card and an additional example dual-compact-form-factor expansion card that is fitted with a removable heat sink.

FIG. 11 is a plan view of an example intermediary expansion card 1100 that may include two dual-compact-form-factor expansion sockets for accepting two separate dual-compact-form-factor expansion modules, such as two instances of expansion card 100, as discussed above. As shown in this figure, a dual-compact-form-factor expansion card 1102 may be inserted into a corresponding dual-compact-form-factor expansion socket 1104, thereby providing hardware acceleration functionality to intermediary expansion card 1100. Intermediary expansion card 1100 may also include an additional dual-compact-form-factor expansion card inserted into an additional corresponding dual-compact-form-factor expansion socket, but the additional expansion card and the additional expansion socket may be obscured by heat sink 1106 that may be affixed to the additional dual-compact-form-factor expansion card. Heat sink 1106 may illustrate one of a variety of devices that may provide cooling to one or more dual-compact-form-factor expansion cards. Furthermore, as shown in this figure, intermediary expansion card 1100 may also include an edge connector 1108, which in this example may be dimensioned or formatted according to the PCI EXPRESS pinout specification.

As first discussed above, the disclosed systems may be scaled along a variety of dimensions, including, for example, by increasing the number of instances of expansion card 100 within a computing device, increasing the number of modular computing devices or modular storage devices (each of which may contain instances of expansion card 100), increasing the number of sleds connected within the chassis of a multi-node compute platform (each of which may contain multiple modular computing and/or storage devices), and/or increasing the number of server racks or chasses within a multi-node compute platform. As such, the disclosed systems and methods demonstrate that a multi-node compute platform may be designed or retrofitted to scale by inserting and/or activating one or more dual-compact-form-factor expansion cards (such as expansion card 100 with hardware accelerator 104), thereby conveniently and immediately making these additional resources available to a corresponding program, service, application, and/or process.

Figure 12:
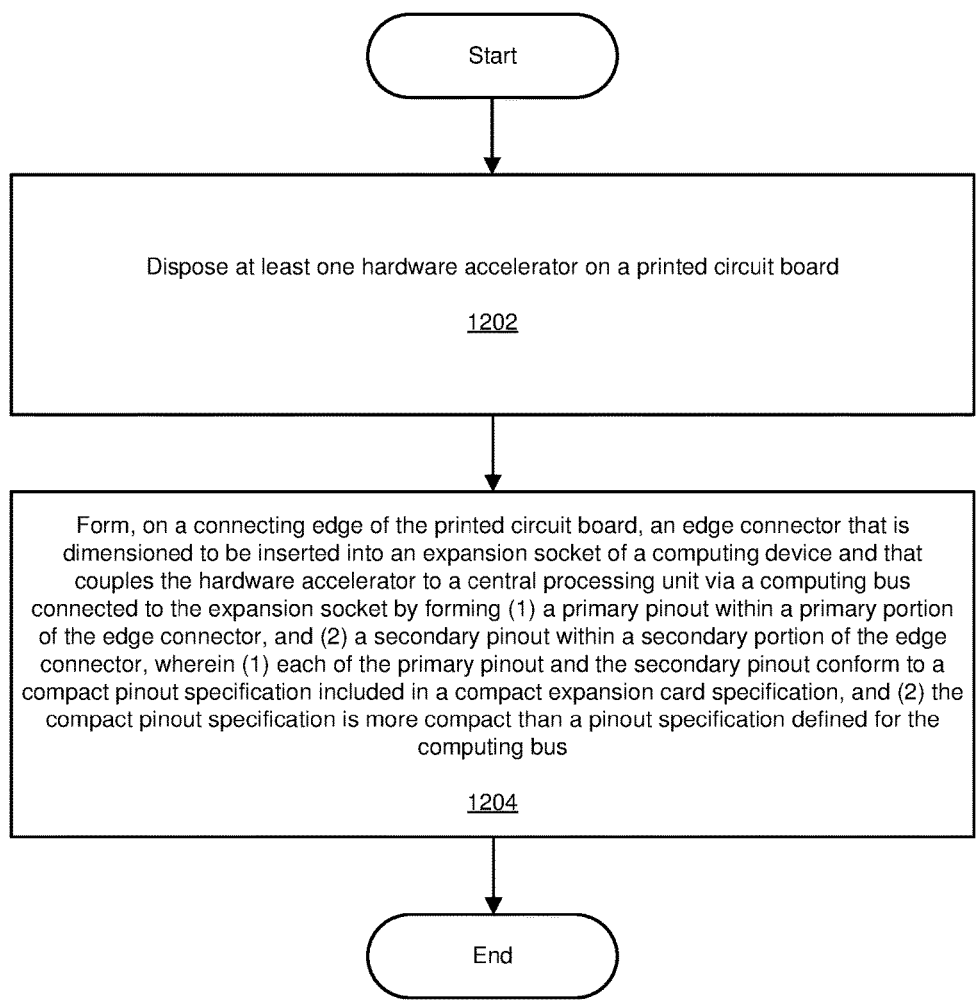
FIG. 12 is a flow diagram of an example method for forming a dual-compact-form-factor expansion card in accordance with some embodiments.

FIG. 12 is a flow diagram of an example method 1200 for manufacturing, assembling, using, adjusting, or otherwise configuring or creating the systems and apparatuses presented herein. The steps shown in FIG. 12 may be performed by any individual and/or by any suitable type or form of manual and/or automated apparatus. In particular, FIG. 12 illustrates a flow diagram of an example method 1200 for manufacturing a dual-compact-form-factor expansion card as described herein.

As shown in FIG. 12, at step 1202, the method may include disposing at least one hardware accelerator on a printed circuit board. For example, hardware accelerator 104 may be disposed on printed circuit board 102. In some examples, as described above, hardware accelerator may include application-specific hardware circuitry designed to perform a computing task, such as an artificial intelligence inference task that applies a model trained on known data to infer at least one label for new data, and/or a video transcoding task.

Hardware accelerator 104 may be disposed on printed circuit board 102 in any suitable way, such as via any suitable manual or automated placement process, and/or any suitable mounting process, such as a surface-mount technology mounting process, a through-hole technology mounting process, and/or a plug-in technology mounting process.

At step 1204, the method may further include forming, on a connecting edge of the printed circuit board, an edge connector that is dimensioned to be inserted into an expansion socket of a computing device and that couples the hardware accelerator to a central processing unit of the computing device via a computing bus connected to the expansion socket when inserted into the expansion socket. For example, edge connector 108 may be formed on connecting edge 110 of printed circuit board 102 and may connect hardware accelerator 104 to a central processing unit of a computing device via a computing bus when inserted into a suitably configured expansion socket. Edge connector 108 may be formed on connecting edge 110 of printed circuit board 102 in any suitable way, such as via any suitable routing, cutting, and or moulding process.

Edge connector 108 may be formed in a variety of contexts. For example, as further shown in step 1204, edge connector 108 may be formed by forming a primary pinout within a primary portion of the edge connector and a secondary pinout within a secondary portion of the edge connector such that (1) each of the primary pinout and the secondary pinout conform to a compact pinout specification included in a compact expansion card specification, and (2) the compact pinout specification is more compact than a pinout specification defined for the computing bus.

By way of illustration, as described above in reference to FIGS. 3-5, expansion card 100 may include primary pinout 502 disposed within a primary portion of edge connector 108 and secondary pinout 504 disposed within secondary portion 404 of edge connector 108. Each of primary pinout 502 and secondary pinout 504 may conform to a compact pinout specification included in a compact expansion card specification, such as an M-key pinout specification included in an M.2 specification.

In some examples, forming the edge connector may further include forming (1) a primary key notch within the primary portion of the edge connector in accordance with the compact expansion card specification, and (2) a secondary key notch within the secondary portion of the edge connector. For example, primary key notch 506 may be formed within primary portion 402 of edge connector 108, and secondary key notch 508 may be formed within secondary portion 404 of edge connector 108. In at least some examples, primary key notch 506 and/or secondary key notch 508 may be formed such that primary key notch has a width that is narrower than a width of secondary key notch 508. For instance, primary key notch 506 may be formed such that it has a width of 1.2 mm±0.05 mm, and secondary key notch 508 may be formed such that it has a width of 1.4 mm±0.05 mm.

Furthermore, in some examples, a primary pinout (e.g., primary pinout 502) may include a primary set of connector traces, and the secondary pinout (e.g., secondary pinout 504) may include a secondary set of connector traces. In some of these examples, forming the primary pinout may include forming each connector trace included in the set of connector traces in accordance with a target routing tolerance that is narrower than a routing tolerance specification included in the compact expansion card specification, and a target true position that is narrower than a true position specification included in the compact expansion card specification. For example, the connector traces included in primary pinout 502 and secondary pinout 504 may be formed in accordance with (1) a routing tolerance of ±0.05 mm instead of a specified routing tolerance of ±0.10 mm, and (2) a target true position of ±0.12 mm instead of a specified true position of ±0.12 mm.

As discussed throughout the instant disclosure, the disclosed apparatuses, systems, and methods may provide one or more advantages over traditional options for performing hardware acceleration of complex computational tasks. For example, by offloading complex computational tasks to hardware accelerators included in dual-compact-form-factor expansion cards, the disclosed systems and methods may alleviate or ameliorate a burden on a central processing unit of a computing system that may otherwise be requested to perform such complex computational tasks (e.g., a domain controller).

Additionally, by including a plurality (e.g., two or more) of pinouts within a single edge connector that each conform to a compact pinout specification, dual-compact-form-factor expansion cards as described herein may increase resources available to components disposed on a printed circuit board, such as electrical resources, bandwidth resources, and so forth. Also, a dual-compact-form-factor expansion card may include a printed circuit board with a physically larger useful area than traditional compact-form-factor expansion cards (e.g., M.2 expansion cards, U.2 expansion cards, mSATA expansion cards, etc.). Such dual-compact-form-factor expansion cards may therefore accommodate physically larger components, such as physically larger hardware accelerators. These attributes may enable dual-compact-form-factor expansion cards to host and or utilize more powerful hardware accelerators than traditional compact-form-factor expansion cards (e.g., M.2 expansion cards), which may also enable improved hardware acceleration of complex computational tasks. In addition, by utilizing existing compact expansion card specifications for each of the pinouts, the dual-compact-form-factor expansion cards disclosed herein may be easier to design, manufacture, and/or deploy than traditional hardware accelerators.

Furthermore, dual-compact-form-factor expansion sockets, as described herein, may be configured to connect to either a single dual-compact-form-factor expansion card, or a plurality of conventional compact expansion cards. Therefore, such expansion sockets may provide various functions and/or capabilities to computing devices via traditional compact-form-factor expansion cards (e.g., traditional M.2 expansion cards) as well as via dual-compact-form-factor expansion cards.

Thus, embodiments of this disclosure may enable system administrators to flexibly devise, implement, deploy, and/or scale effective custom hardware acceleration strategies while avoiding costs associated with less flexible conventional technologies. Accordingly, the disclosed apparatuses, systems, and method may enable technology enterprises to better handle and adapt to increases in the demand for infrastructure capable of managing computationally expensive computing tasks.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples since many other architectures may be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An expansion card comprising:
   a printed circuit board;
   at least one hardware accelerator, disposed on the printed circuit board, that:
      comprises application-specific hardware circuitry designed to perform a computing task; and
      offloads at least a portion of the computing task from a central processing unit of a computing device by executing, via the application-specific hardware circuitry, the portion of the computing task; and
   an edge connector, disposed on a connecting edge of the printed circuit board, that is dimensioned to be inserted into an expansion socket of the computing device, wherein the edge connector:
      couples the hardware accelerator to the central processing unit via a computing bus connected to the expansion socket when inserted into the expansion socket; and
      comprises a primary pinout, disposed within a primary portion of the edge connector, and a secondary pinout, disposed within a secondary portion of the edge connector, wherein:
         each of the primary pinout and the secondary pinout conform to a compact pinout specification included in a compact expansion card specification; and
         the compact pinout specification is more compact than a pinout specification defined for the computing bus.

2. The expansion card of claim 1, wherein the compact expansion card specification comprises at least one of:
   an M.2 specification;
   a U.2 specification; or
   an mSATA specification.

3. The expansion card of claim 1, wherein the primary portion of the edge connector and the secondary portion of the edge connector are disposed along the edge connector such that a lateral center line of the primary portion of the edge connector is disposed a predefined distance from a lateral center line of the secondary portion of the edge connector.

4. The expansion card of claim 3, wherein the predefined distance from the lateral center line of the secondary portion of the edge connector is, within a predefined manufacturing tolerance, 22.5 millimeters.

5. The expansion card of claim 1, wherein:
   the primary portion of the edge connector defines a primary key notch;
   the secondary portion of the edge connector defines a secondary key notch; and
   a width of the primary key notch is narrower than a width of the secondary key notch.

6. The expansion card of claim 5, wherein:
   the primary key notch has a width, within a predefined manufacturing tolerance, of up to 1.2 millimeters; and
   the secondary key notch has a width, within the predefined manufacturing tolerance, of at least 1.4 millimeters.

7. The expansion card of claim 1, wherein:
   the primary pinout comprises a primary set of connector traces;
   the secondary pinout comprises a secondary set of connector traces; and
   each connector trace included in the primary set of connector traces and the secondary set of connector traces is manufactured in accordance with:
      a target routing tolerance that is narrower than a routing tolerance specification included in the compact expansion card specification; and
      a target true position that is narrower than a true position specification included in the compact expansion card specification.

8. The expansion card of claim 7, wherein the primary set of connector traces and the secondary set of connector traces are manufactured in accordance with a target routing tolerance of within 0.05 millimeters and a target true position of within 0.12 millimeters.

9. The expansion card of claim 1, wherein the printed circuit board comprises:
   a width dimension comprising:
      a multiple of a width specification included in the compact expansion card specification; and
      a predefined buffer distance; and
   a length dimension that conforms to a length specification included in the compact expansion card specification.

10. The expansion card of claim 9, wherein the printed circuit board comprises:
    a width dimension, within a predefined manufacturing tolerance, of 46 millimeters; and
    a length dimension, within the predefined manufacturing tolerance, of 110 millimeters.

11. The expansion card of claim 1, wherein the printed circuit board further comprises:
    a primary fixing notch, defined by an edge of the printed circuit board that is opposite to the connecting edge of the printed circuit board, that is centrally aligned with a center point of the primary portion of the edge connector; and
    a secondary fixing notch, defined by the edge of the printed circuit board that is opposite to the connecting edge of the printed circuit board, that is centrally aligned with a center point of the secondary portion of the edge connector.

12. The expansion card of claim 1, wherein the hardware accelerator comprises at least one of:
    a field-programmable gate array; or
    an application-specific integrated circuit.

13. The expansion card of claim 1, wherein the computing task that the application-specific hardware circuitry is designed to perform comprises an artificial intelligence inference task that applies a model trained on known data to infer at least one label for new data.

14. The expansion card of claim 1, wherein the computing task that the application-specific hardware circuitry is designed to perform comprises a video transcoding task.

15. A system comprising:
    a central processing unit;
    at least one memory device;
    at least one expansion socket; and
    at least one expansion card that comprises:
       a printed circuit board;

at least one hardware accelerator, disposed on the printed circuit board, that:
  comprises application-specific hardware circuitry designed to perform a computing task; and
  offloads at least a portion of the computing task from the central processing unit by executing, via the application-specific hardware circuitry, the portion of the computing task; and
an edge connector, disposed on a connecting edge of the printed circuit board, that is dimensioned to be inserted into the expansion socket, wherein the edge connector:
  couples the hardware accelerator to the central processing unit via a computing bus connected to the expansion socket when the expansion card is inserted into the expansion socket; and
  comprises a primary pinout, disposed within a primary portion of the edge connector, and a secondary pinout, disposed within a secondary portion of the edge connector, wherein:
    each of the primary pinout and the secondary pinout conform to a compact pinout specification included in a compact expansion card specification; and
    the compact pinout specification is more compact than a pinout specification defined for the computing bus.

16. The system of claim 15, wherein the expansion socket is disposed on an intermediary expansion card that comprises a pinout that conforms to the pinout specification defined for the computing bus.

17. The system of claim 15, wherein the system comprises a backend data center of a corporate networking enterprise that provides at least one online service to corresponding users of client devices.

18. A method comprising:
  disposing at least one hardware accelerator on a printed circuit board, wherein the hardware accelerator:
    comprises application-specific hardware circuitry designed to perform a computing task; and
    offloads at least a portion of the computing task from a central processing unit of a computing device by executing, via the application-specific hardware circuitry, the portion of the computing task;
  forming, on a connecting edge of the printed circuit board, an edge connector that is dimensioned to be inserted into an expansion socket of the computing device and that couples the hardware accelerator to the central processing unit via a computing bus connected to the expansion socket when inserted into the expansion socket by forming:
    a primary pinout within a primary portion of the edge connector; and
    a secondary pinout within a secondary portion of the edge connector; wherein:
      each of the primary pinout and the secondary pinout conform to a compact pinout specification included in a compact expansion card specification; and
      the compact pinout specification is more compact than a pinout specification defined for the computing bus.

19. The method of claim 18, wherein:
forming the edge connector further comprises forming:
  a primary key notch within the primary portion of the edge connector in accordance with the compact expansion card specification; and
  a secondary key notch within the secondary portion of the edge connector; and
the primary key notch has a width that is narrower than a width of the secondary key notch.

20. The method of claim 18, wherein:
the primary pinout comprises a primary set of connector traces;
the secondary pinout comprises a secondary set of connector traces; and
forming the primary pinout and the secondary pinout comprises forming each connector trace included in the primary set of connector traces and the secondary set of connector traces in accordance with:
  a target routing tolerance that is narrower than a routing tolerance specification included in the compact expansion card specification; and
  a target true position that is narrower than a true position specification included in the compact expansion card specification.

* * * * *